(12) United States Patent
Aggarwal et al.

(10) Patent No.: US 11,043,630 B2
(45) Date of Patent: Jun. 22, 2021

(54) METHOD OF MANUFACTURING A MAGNETORESISTIVE DEVICE

(71) Applicant: Everspin Technologies, Inc., Chandler, AZ (US)

(72) Inventors: Sanjeev Aggarwal, Scottsdale, AZ (US); Sarin A. Deshpande, San Jose, CA (US)

(73) Assignee: Everspin Technologies, Inc., Chandler, AZ (US)

( * ) Notice: Subject to any disclaimer, the term of this patent is extended or adjusted under 35 U.S.C. 154(b) by 0 days.

(21) Appl. No.: 16/695,396

(22) Filed: Nov. 26, 2019

(65) Prior Publication Data

US 2020/0176672 A1 Jun. 4, 2020

Related U.S. Application Data

(60) Provisional application No. 62/774,552, filed on Dec. 3, 2018.

(51) Int. Cl.
*H01L 43/04* (2006.01)
*H01L 21/3065* (2006.01)
*H01L 43/14* (2006.01)

(52) U.S. Cl.
CPC .......... *H01L 43/04* (2013.01); *H01L 21/3065* (2013.01); *H01L 43/14* (2013.01)

(58) Field of Classification Search
CPC ...... H01L 43/04; H01L 43/14; H01L 21/3065
See application file for complete search history.

(56) References Cited

U.S. PATENT DOCUMENTS

| | | | |
|---|---|---|---|
| 8,686,484 B2 | 4/2014 | Whig et al. | |
| 8,747,680 B1 | 6/2014 | Deshpande et al. | |
| 9,023,216 B2 | 5/2015 | Kochergin et al. | |
| 9,136,464 B1 | 9/2015 | Whig et al. | |
| 9,269,894 B2* | 2/2016 | Mudivarthi | H01L 43/02 |
| 9,419,208 B2 | 8/2016 | Whig et al. | |
| 10,461,251 B2* | 10/2019 | Aggarwal | H01L 27/222 |
| 2011/0233697 A1* | 9/2011 | Kajiyama | H01L 27/228 |
| | | | 257/421 |
| 2016/0225981 A1* | 8/2016 | Deshpande | H01L 43/12 |
| 2017/0125663 A1* | 5/2017 | Nagel | H01L 43/12 |
| 2018/0033959 A1* | 2/2018 | Deshpande | H01L 43/08 |
| 2018/0158498 A1 | 6/2018 | Aggarwal et al. | |
| 2019/0131519 A1 | 5/2019 | Ikegawa et al. | |
| 2019/0140167 A1 | 5/2019 | Aggarwal et al. | |
| 2019/0157549 A1 | 5/2019 | Sun | |
| 2019/0165253 A1 | 5/2019 | Sun et al. | |
| 2019/0173004 A1 | 6/2019 | Deshpande et al. | |

* cited by examiner

*Primary Examiner* — Kyung S Lee
(74) *Attorney, Agent, or Firm* — Bookoff McAndrews, PLLC

(57) ABSTRACT

A magnetoresistive device may include an intermediate region positioned between a magnetically fixed region and a magnetically free region, and spin Hall channel region extending around a sidewall of at least the magnetically free region. An insulator region may extend around a portion of the sidewall such that the insulator region contacts a first portion of the sidewall and the spin Hall channel region contacts a second portion of the sidewall.

20 Claims, 16 Drawing Sheets

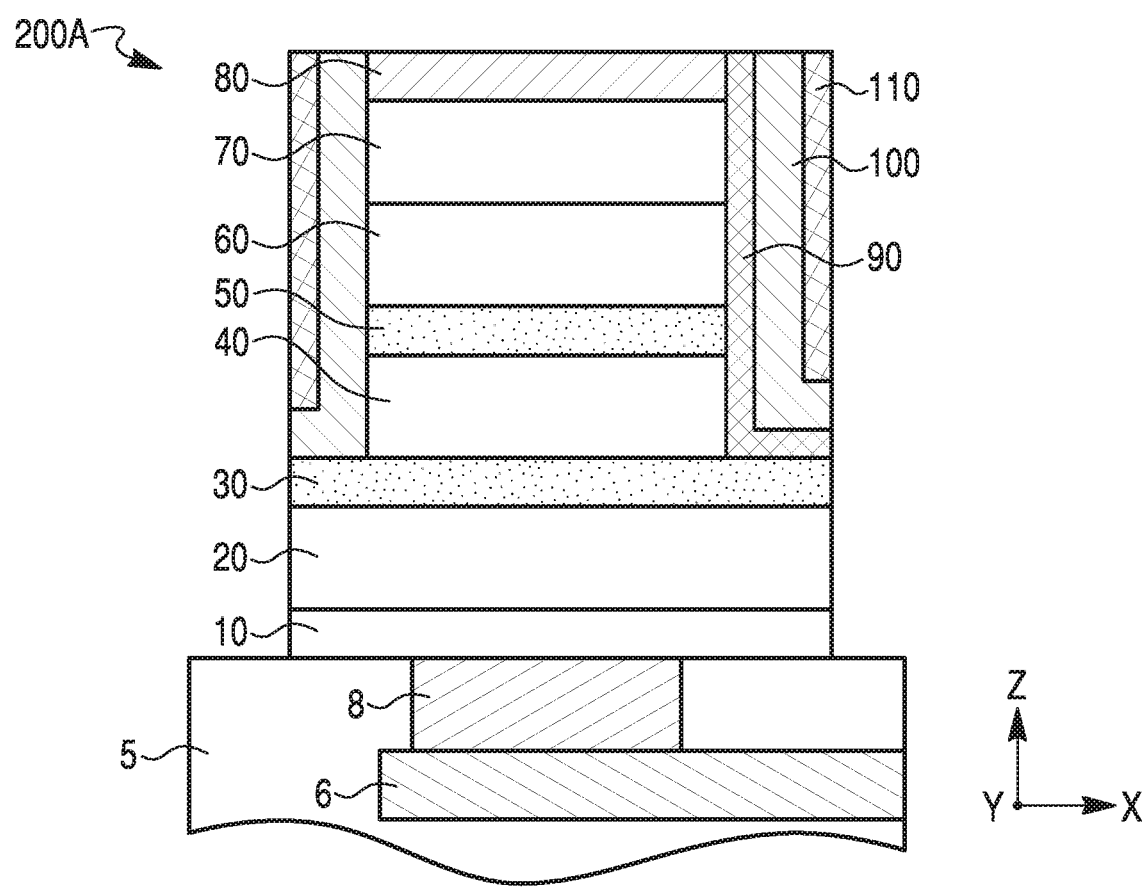

METHOD OF MANUFACTURING A MAGNETORESISTIVE DEVICE

CROSS-REFERENCE TO RELATED APPLICATION(S)

This application claims the benefit of priority from U.S. Provisional Application No. 62/774,552, filed on Dec. 3, 2018, which is incorporated by reference herein in its entirety.

TECHNICAL FIELD

The present disclosure relates to, among other things, methods for fabricating magnetoresistive devices, the resulting magnetoresistive devices, and methods of using the disclosed magnetoresistive devices.

INTRODUCTION

In one or more embodiments, the present disclosure relates to a method of fabricating a magnetoresistive device having a magnetoresistive stack or structure (for example, part of a magnetoresistive memory device and/or magnetoresistive sensor/transducer device) and methods of manufacturing and operating the described magnetoresistive devices. In one embodiment, an exemplary magnetoresistive stack (for example, used in a magnetic tunnel junction (MTJ) magnetoresistive device) of the present disclosure includes one or more layers of magnetic or ferromagnetic material.

Briefly, a magnetoresistive stack used in a memory device (e.g., a magnetoresistive random access memory (MRAM)) of the present disclosure includes at least one non-magnetic layer (for example, at least one dielectric layer or a non-magnetic yet electrically conductive layer) disposed between a "fixed" magnetic region and a "free" magnetic region, each including one or more layers of ferromagnetic materials. Information is stored in the magnetoresistive memory stack by switching, programming, and/or controlling the direction of magnetization vectors in the magnetic layer(s) of the "free" magnetic region. The direction of the magnetization vectors of the "free" magnetic region may be switched and/or programmed (for example, through spin orbit torque (SOT) and/or spin transfer torque (STT)) by application of a write signal (e.g., one or more current pulses) adjacent to, or through, the magnetoresistive memory stack. In contrast, the magnetization vectors in the magnetic layers of a "fixed" magnetic region are magnetically fixed in a predetermined direction during application of the write signal. When the magnetization vectors of the "free" magnetic region adjacent to the non-magnetic layer are in the same direction as the magnetization vectors of the "fixed" magnetic region adjacent to the non-magnetic layer, the magnetoresistive memory stack has a first magnetic state. Conversely, when the magnetization vectors of the "free" magnetic region adjacent to the non-magnetic layer are opposite the direction of the magnetization vectors of the "fixed" magnetic region adjacent to the non-magnetic layer, the magnetoresistive memory stack has a second magnetic state. The magnetoresistive memory stack has different electrical resistances in the first and second magnetic states. The magnetic state of the magnetoresistive memory stack is determined or read based on the resistance of the stack in response to a read current applied, for example, through the magnetoresistive stack.

The present disclosure relates to methods of fabricating a magnetoresistive device having a magnetoresistive stack and the devices resulting therefrom. The disclosed fabrication methods may result in improvements in efficiency and/or characteristics of the fabrication process and the resulting devices. The scope of the current disclosure, however, is defined by the attached claims, and not by any characteristics of the fabrication method and the resulting devices.

BRIEF DESCRIPTION OF THE DRAWINGS

Embodiments of the present disclosure may be implemented in connection with aspects illustrated in the attached drawings. These drawings show different aspects of the present disclosure and, where appropriate, reference numerals illustrating like structures, components, materials, and/or elements in different figures are labeled similarly. It is understood that various combinations of the structures, components, and/or elements, other than those specifically shown, are contemplated and are within the scope of the present disclosure.

For simplicity and clarity of illustration, the figures depict the general structure and/or manner of construction of the various embodiments described herein. For ease of illustration, the figures depict the different layers/regions of the illustrated magnetoresistive stacks as having a uniform thickness and well-defined boundaries with straight edges. However, a person skilled in the art would recognize that, in reality, the different layers typically have a non-uniform thickness. And, at the interface between adjacent layers, the materials of these layers may alloy together, or migrate into one or the other material, making their boundaries ill-defined. Descriptions and details of well-known features (e.g., interconnects, etc.) and techniques may be omitted to avoid obscuring other features. Elements in the figures are not necessarily drawn to scale. The dimensions of some features may be exaggerated relative to other features to improve understanding of the exemplary embodiments. The drawings are simplifications provided to help illustrate the relative positioning of various regions/layers and describe various processing steps. One skilled in the art would appreciate that the regions are not necessarily drawn to scale and should not be viewed as representing proportional relationships between different regions/layers. Moreover, while certain regions/layers and features are illustrated with straight 90-degree edges, in actuality or practice such regions/layers may be more "rounded", curved, and/or gradually sloping.

Further, one skilled in the art would understand that, although multiple layers with distinct interfaces are illustrated in the figures, in some cases, over time and/or exposure to high temperatures, materials of some of the layers may migrate into or interact with materials of other layers to present a more diffuse interface between these layers. It should be noted that, even if it is not specifically mentioned, aspects described with reference to one embodiment may also be applicable to, and may be used with, other embodiments.

Moreover, there are many embodiments described and illustrated herein. The present disclosure is neither limited to any single aspect nor embodiment thereof, nor to any combinations and/or permutations of such aspects and/or embodiments. Moreover, each aspect of the present disclosure, and/or embodiments thereof, may be employed alone or in combination with one or more of the other aspects of the present disclosure and/or embodiments thereof. For the sake of brevity, certain permutations and combinations are not discussed and/or illustrated separately herein. Notably, an embodiment or implementation described herein as "exemplary" is not to be construed as preferred or advantageous, for example, over other embodiments or implementations; rather, it is intended to reflect or indicate that the embodiment(s) is/are "example" embodiment(s). Further, even though the figures and this written disclosure appear to describe the magnetoresistive stacks of the disclosed magnetoresistive devices in a particular order of construction (e.g., from bottom to top), it is understood that the depicted magnetoresistive stacks may have a different order (e.g., the opposite order (i.e., from top to bottom)).

Figure 1A:
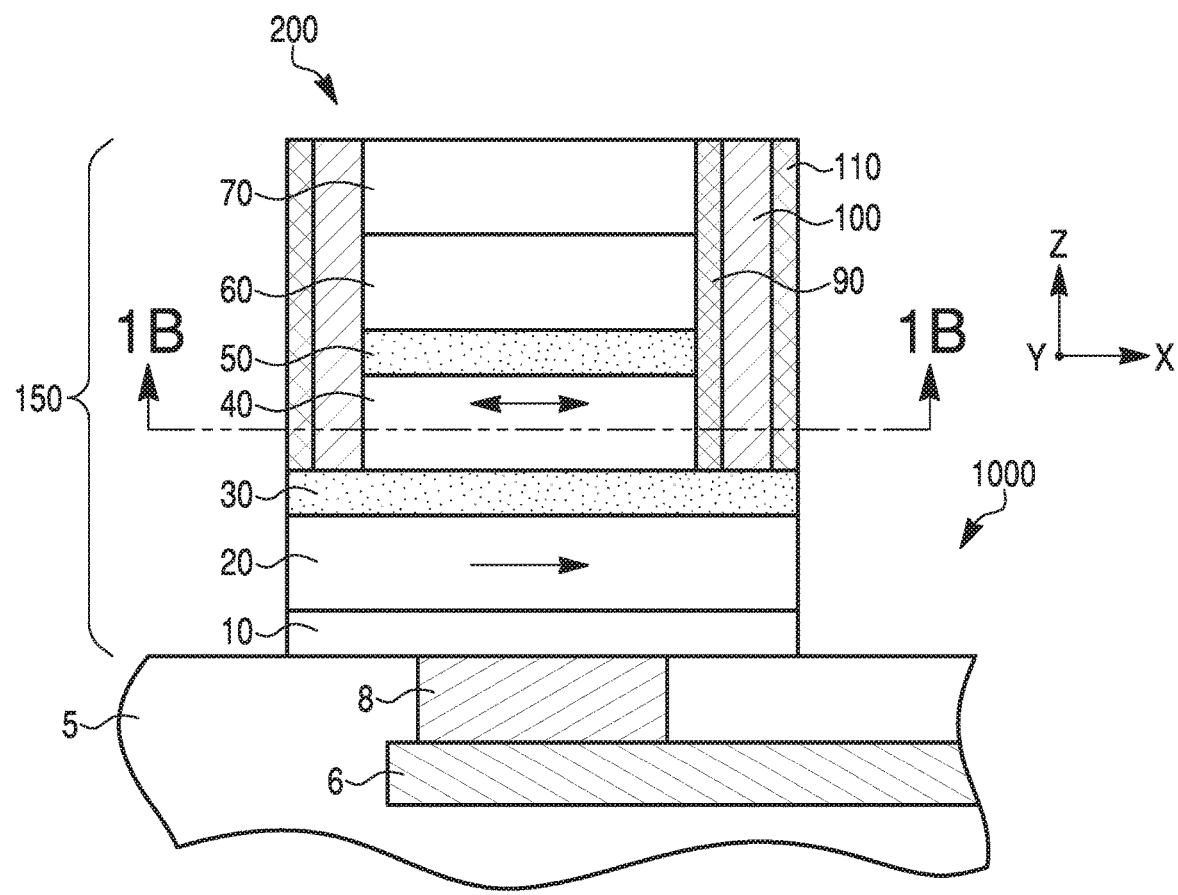
Figure 1B:
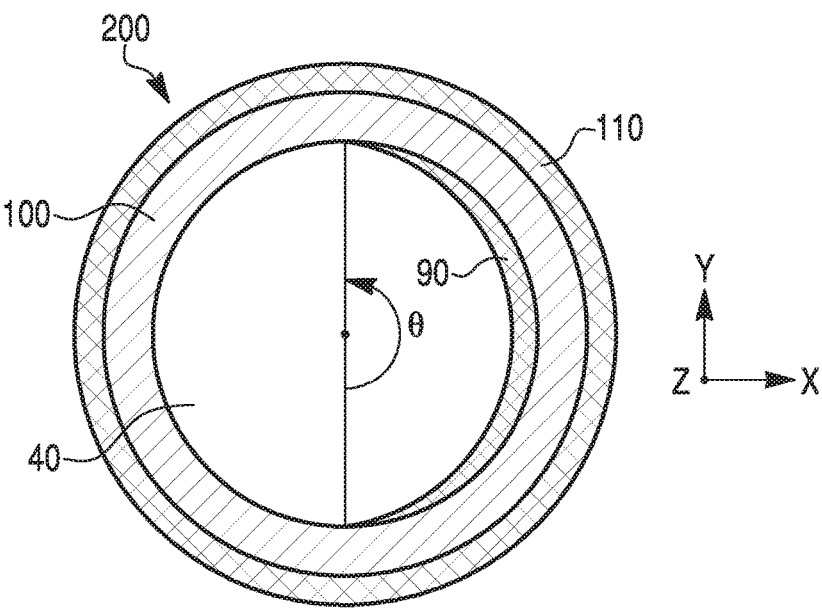
Figure 2A:
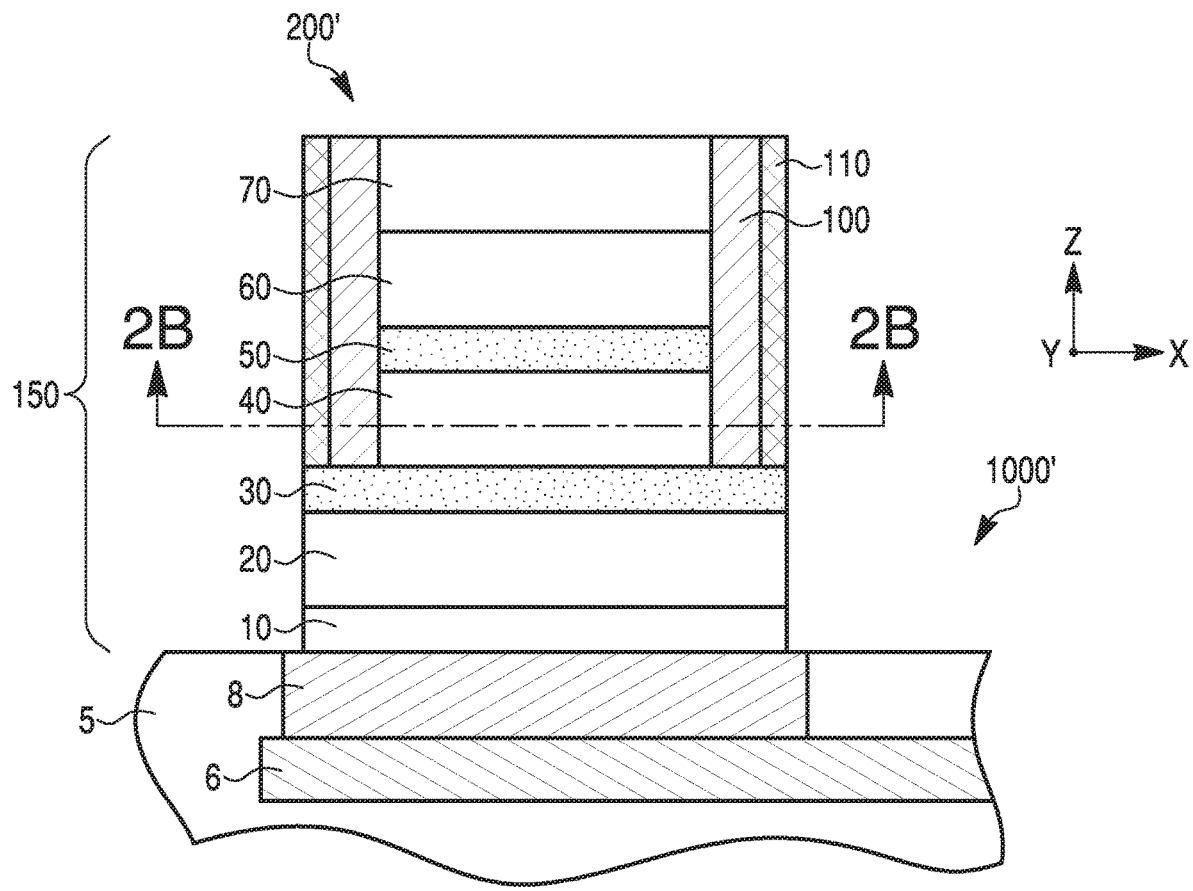
Figure 2B:
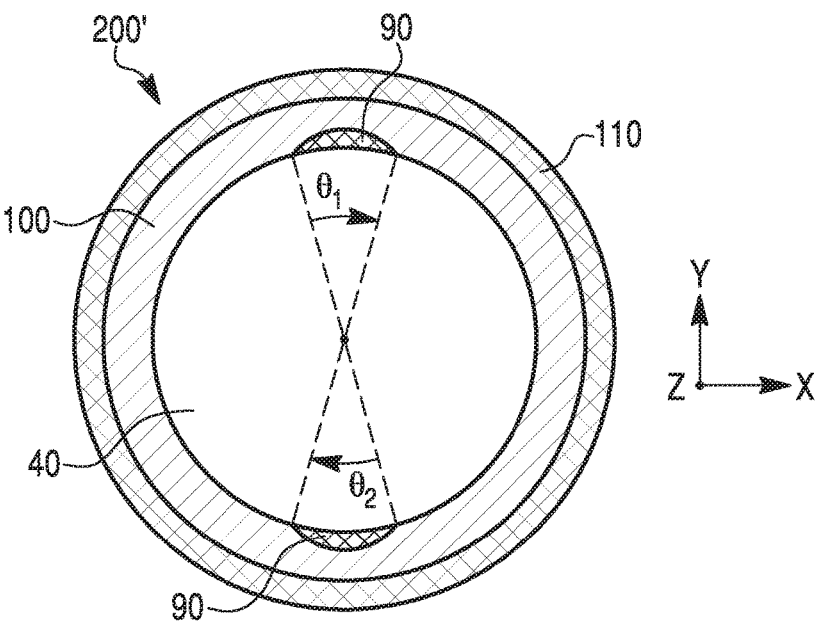
Figure 3A:
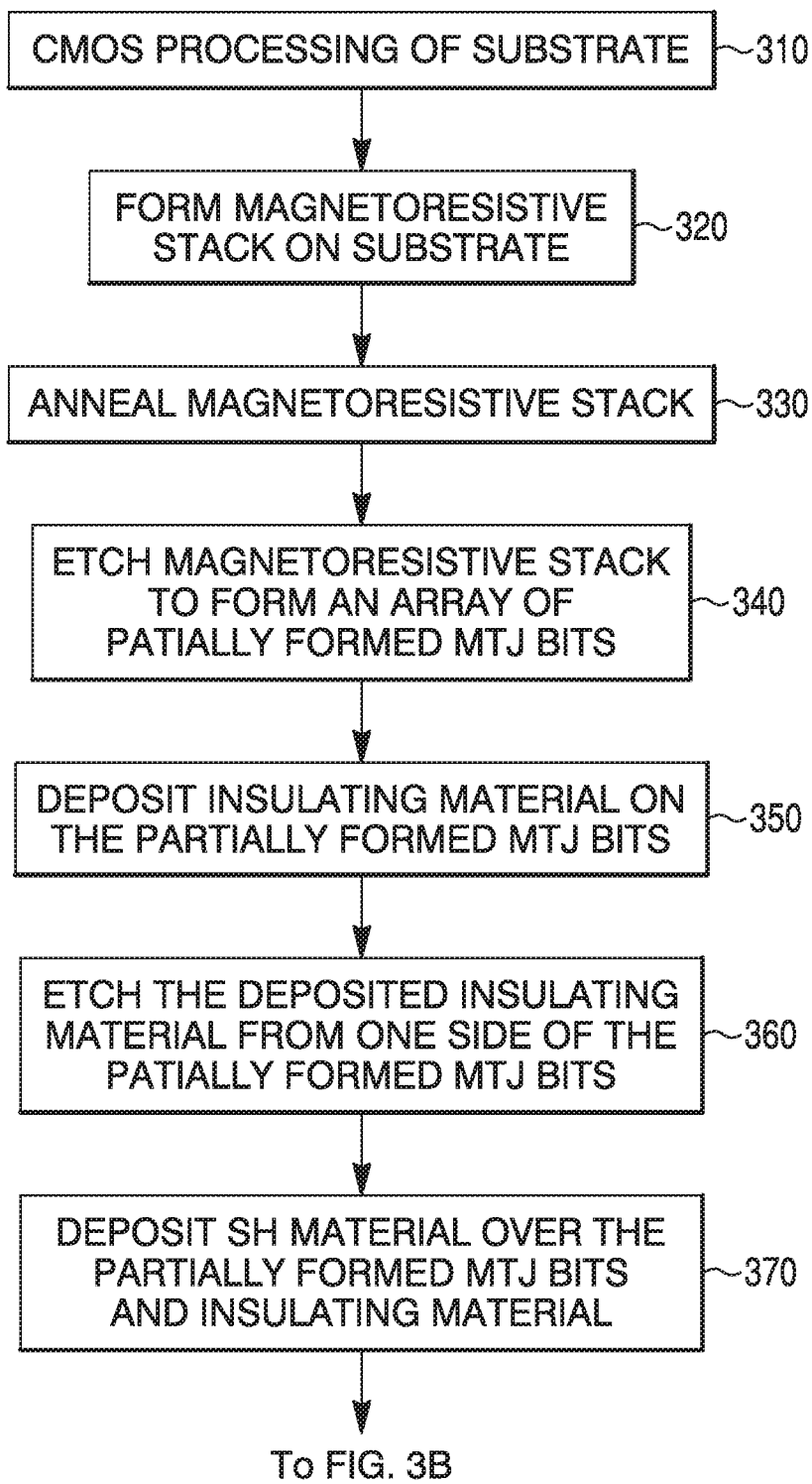
Figure 3B:
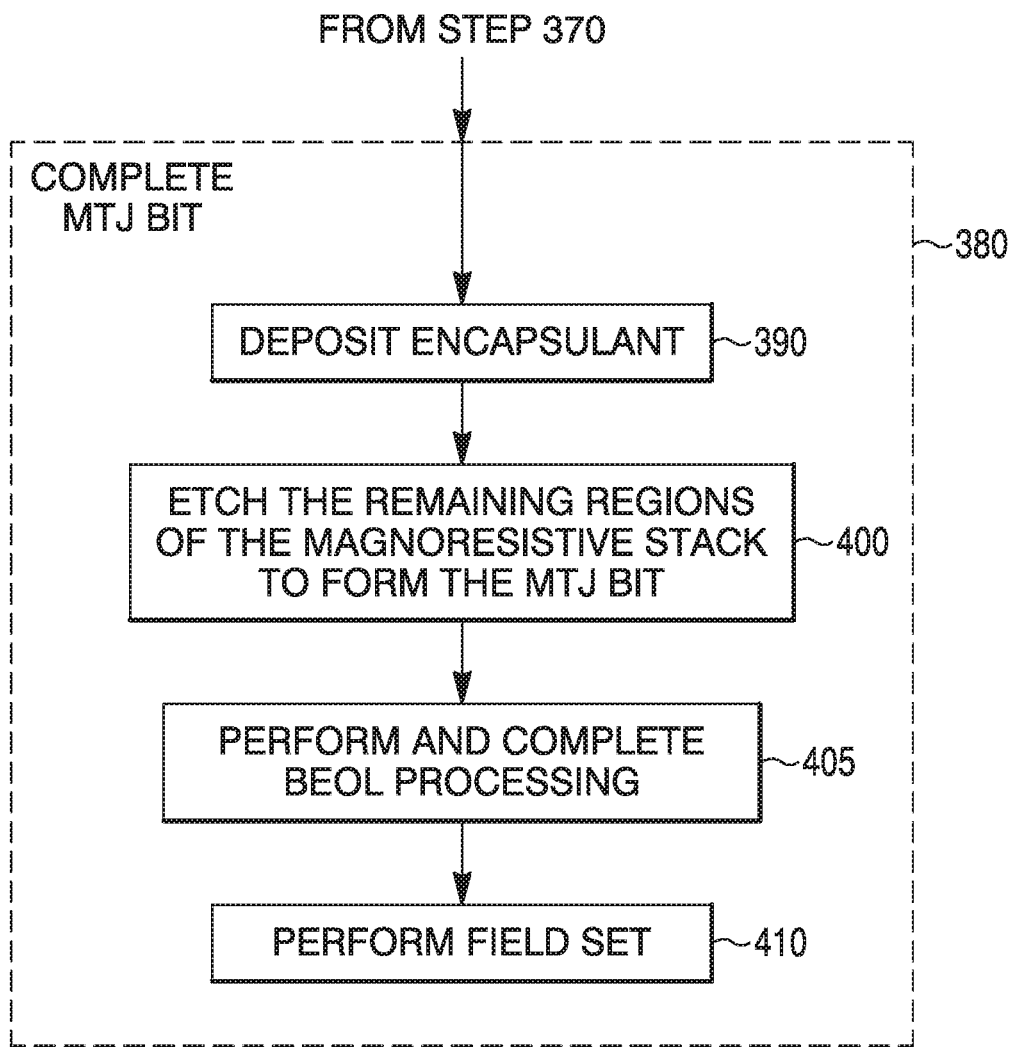
Figure 5:
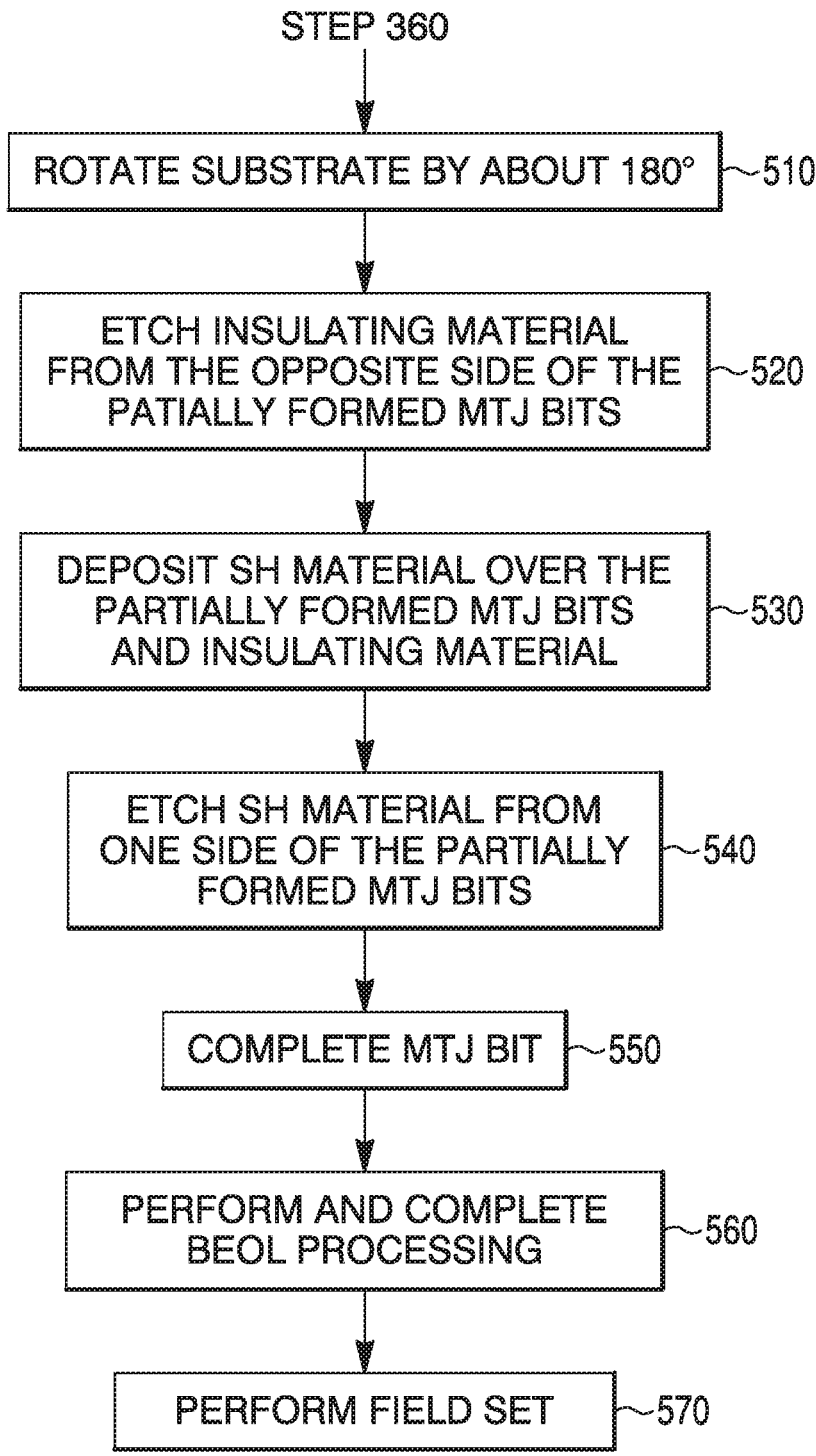
Figure 7:
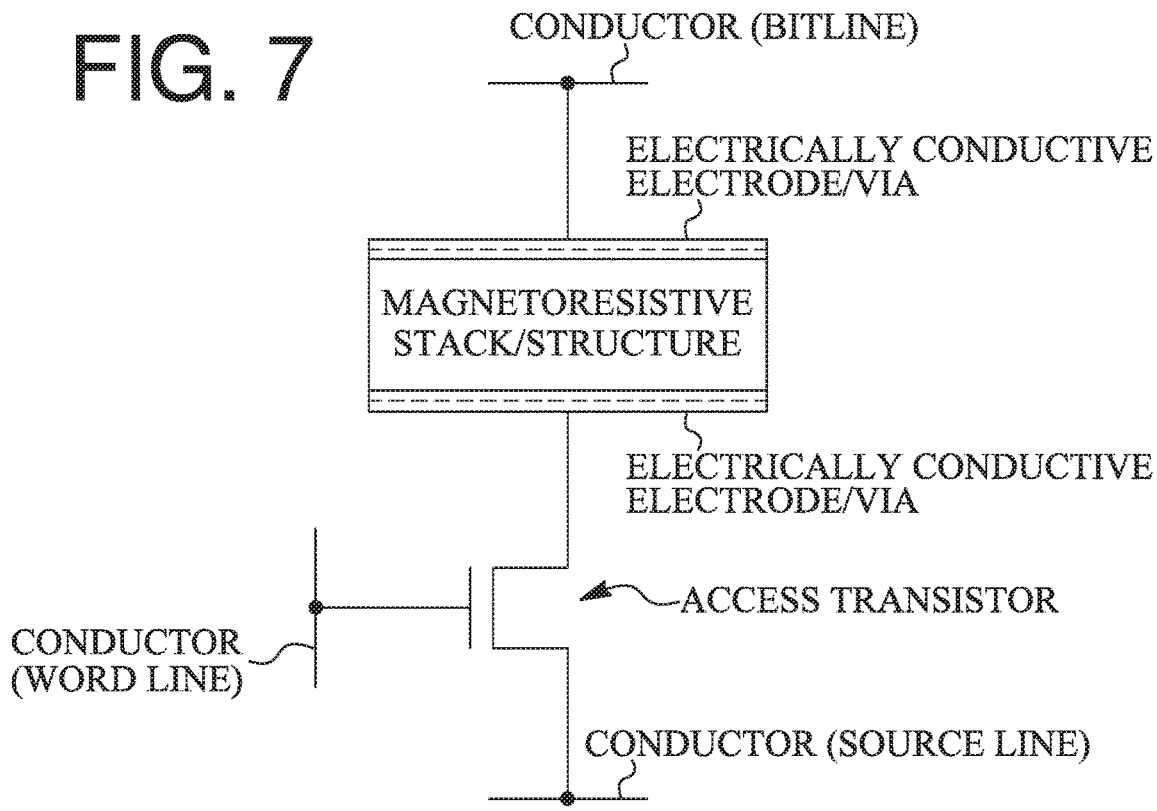
Figure 8A:
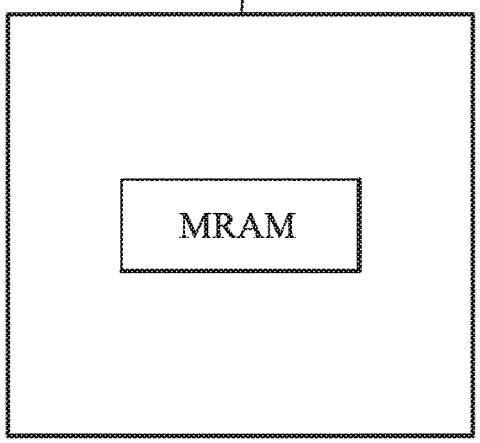
Figure 8B:
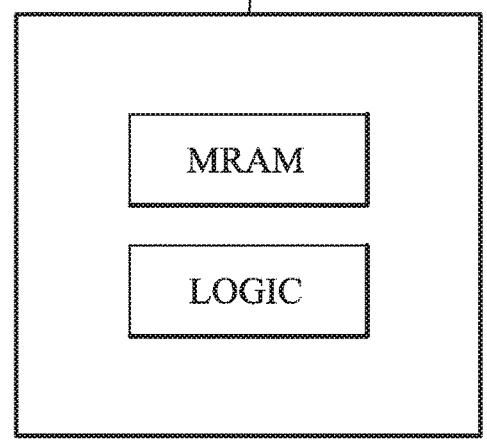

FIGS. 1A-1B are simplified cross-sectional illustrations of an exemplary MTJ bit of a magnetoresistive device according to one or more embodiments of the present disclosure;

FIGS. 2A-2B are simplified cross-sectional illustrations of another exemplary MTJ bit of a magnetoresistive device according to one or more embodiments of the present disclosure;

FIGS. 3A and 3B are flow charts that illustrate an exemplary method of fabricating the MTJ device of FIGS. 1A and 1B;

FIGS. 4A-4K are schematic illustrations of a partially formed MTJ device at different stages of the fabrication process of FIGS. 3A and 3B;

FIG. 5 is a flow chart that illustrates an exemplary method of fabricating the MTJ device of FIGS. 2A and 2B;

FIGS. 6A-6F are schematic illustrations of a partially formed MTJ device at different stages of the fabrication process of FIG. 5;

FIG. 7 is a schematic diagram of an exemplary magnetoresistive memory stack/structure electrically connected to an access transistor in a magnetoresistive memory cell configuration; and FIGS. 8A-8B are schematic block diagrams of integrated circuits including a discrete memory device and an embedded memory device, each including MRAM (which, in one embodiment is representative of one or more arrays of MRAM having a plurality of magnetoresistive memory stacks/structures, according to aspects of certain embodiments of the present disclosure.

Again, there are many embodiments described and illustrated herein. The present disclosure is neither limited to any single aspect nor embodiment thereof, nor to any combinations and/or permutations of such aspects and/or embodiments. Each of the aspects of the present disclosure, and/or embodiments thereof, may be employed alone or in combination with one or more of the other aspects of the present disclosure and/or embodiments thereof. For the sake of brevity, many of those combinations and permutations are not discussed separately herein.

DETAILED DESCRIPTION

It should be noted that all numeric values disclosed herein (including all disclosed thickness values, limits, and ranges) may have a variation of ±10% (unless a different variation is specified) from the disclosed numeric value. For example, a layer disclosed as being "t" units thick can vary in thickness from (t−0.1t) to (t+0.1t) units. Further, all relative terms such as "about," "substantially," "approximately," etc. are used to indicate a possible variation of ±10% (unless noted otherwise or another variation is specified). Moreover, in the claims, values, limits, and/or ranges of the thickness and atomic composition of, for example, the described layers/regions, mean the value, limit, and/or range±10%.

It should be noted that the description set forth herein is merely illustrative in nature and is not intended to limit the embodiments of the subject matter, or the application and uses of such embodiments. Any implementation described herein as exemplary is not to be construed as preferred or advantageous over other implementations. Rather, the term "exemplary" is used in the sense of example or "illustrative," rather than "ideal." The terms "comprise," "include," "have," "with," and any variations thereof are used synonymously to denote or describe a non-exclusive inclusion. As such, a device or a method that uses such terms does not include only those elements or steps, but may include other elements and steps not expressly listed or inherent to such device and method. Further, the terms "first," "second," and the like, herein do not denote any order, quantity, or importance, but rather are used to distinguish one element from another. Similarly, terms of relative orientation, such as "top," "bottom," etc. are used with reference to the orientation of the structure illustrated in the figures being described. Moreover, the terms "a" and "an" herein do not denote a limitation of quantity, but rather denote the presence of at least one of the referenced item.

It should further be noted that, although exemplary embodiments are described in the context of MTJ stacks/structures, the present inventions may also be implemented in connection with giant magnetoresistive (GMR) stacks/structures where a conductor (e.g., a layer of copper) is disposed between two ferromagnetic regions/layers/materials. Embodiments of the present disclosure may be employed in connection with other types of magnetoresistive stacks/structures where such stacks/structures include a "fixed" magnetic region and a "free" magnetic region. For the sake of brevity, the discussions and illustrations presented in this disclosure will not be repeated specifically in the context of GMR or other magnetoresistive stacks/structures (e.g., anisotropic magnetoresistive (AMR) devices), but the discussion and drawings described below are to be interpreted as being entirely applicable to GMR and other magnetoresistive stacks/structures (e.g., AMR-type devices).

In this disclosure, the term "region" may be used generally to refer to one or more layers. That is, a region (as used herein) may include a single layer (deposit, film, coating, etc.) of material or multiple layers of materials stacked one on top of another (i.e., a multi-layer structure). Further, although in the description below, the different regions, materials, and/or layers in the disclosed magnetoresistive devices may be referred to by specific names (e.g., bottom electrode, top electrode, positive spin Hall (SH) material (i.e., with positive spin Hall angle), negative SH material (i.e., with negative spin Hall angle which is opposite to the spin Hall angle of a "positive" SH material), "fixed" magnetic region, "free" magnetic region), this is only for ease of description and not intended as a functional description or relative location/orientation of the layer. Moreover, although the description below and the figures appear to depict a certain orientation of the layers relative to each other, those of ordinary skill in the art will understand that such descriptions and depictions are only exemplary. For example, though a free region of a magnetoresistive stack may be depicted as being "above" an intermediate layer of that stack, in some aspects the entire depicted magnetoresistive stack may be flipped such that the free region is "below" the intermediate layer.

In one exemplary embodiment, a magnetoresistive stack of a magnetoresistive device of the present disclosure may be implemented as an SOT MRAM element. In such embodiments, the magnetoresistive stack may include an intermediate layer disposed (e.g., sandwiched) between two ferromagnetic regions to form an MTJ device or an MTJ-type device. Of the two ferromagnetic regions disposed on either side of the intermediate layer, one ferromagnetic region may be a "fixed" (or pinned) magnetic region, and the other ferromagnetic region may be a "free" magnetic region. The term "free" is intended to refer to ferromagnetic regions having a magnetic moment that may shift or move significantly in response to applied magnetic fields or spin-polarized currents used to switch the magnetic moment vector. Relatedly, the words "fixed" or "pinned" are used to refer to ferromagnetic regions having a magnetic moment vector that does not move substantially in response to such applied magnetic fields or spin-polarized currents. For the sake of brevity, in the description below, a "fixed" magnetic region will be referred to as a fixed region, and a "free" magnetic region will be referred to as a free region.

As is known in the art, an electrical resistance of the described magnetoresistive stack may change based on whether the magnetization direction (e.g., the direction of the magnetic moment) of the free region adjacent to the non-magnetic layer (e.g., a tunnel barrier) is in parallel alignment or in an antiparallel alignment with the magnetization direction (e.g., the direction of the magnetic moment) of the fixed region adjacent to the non-magnetic layer. Typically, if the two regions have the same magnetization alignment, the resulting relatively low resistance is considered as a digital "0," while, if the alignment is antiparallel, the resulting relatively higher resistance is considered to be a digital "1." A memory device (e.g., an MRAM) may include multiple magnetoresistive stacks, which may be referred to as memory cells or elements, arranged in an array of columns and rows. By measuring the current through each cell, the resistance of each cell, and thus the data stored in the memory array can be read.

FIGS. 1A and 1B are simplified cross-sectional illustrations of an exemplary MTJ bit 200 of a magnetoresistive device 1000. FIG. 1A illustrates a cross-sectional view in the XZ plane, and FIG. 1B illustrates a cross-sectional view in the XY plane. In the discussion below, reference will be made to both FIGS. 1A and 1B. MTJ bit 200 may be formed on a planar surface of a substrate 5 (e.g., a processed semiconductor substrate, interconnect layers deposited on the back end of an integrated circuit device, etc.) having IC devices (e.g., CMOS devices, such as, for example, transistors, etc.) formed thereon or therein. As illustrated in FIG. 1A, MTJ bit 200 may be coupled or otherwise connected to an access transistor (or other suitable select devices, such as, e.g., a diode) and to various conductors (e.g., source line conductor, word line conductor, bit line conductor, etc.) formed on (or in) substrate 5 through an electrically conductive via 8 and interconnect 6. These conductors and CMOS devices provide access to, and direct control signals to, MTJ bit 200 (e.g., to read and write MTJ bit 200). It should be noted that, although MTJ bit 200 is illustrated as having a substantially circular cross-sectional shape in the XY plane (see FIG. 1B), this is only exemplary. In general, MTJ bit 200 may have any 3-dimensional shape (such as, for example, elliptical, rectangular, trapezoidal, pyramidal, cylindrical, conical, or other shape). Further, although via 6 is illustrated as being smaller (e.g., in diameter) than MTJ bit 200, this is only exemplary. In some embodiments, via 6 may be larger (e.g., in diameter) than MTJ bit 200 (see, for example, the embodiment of MTJ bit 200' of FIG. 2A).

MTJ bit 200 includes a magnetoresistive stack 150 with multiple regions formed one above the other. It should be noted that the simplified illustration of MTJ bit 200 in FIGS. 1A and 1B is not intended to show a detailed structure or configuration of MTJ bit 200. As illustrated in FIG. 1A, MTJ bit 200 may be formed between a first electrode 10 (e.g., a bottom electrode) and a second electrode 70 (e.g., a top electrode). First and second electrodes 10, 70 may comprise an electrically conductive material, and may be part of (or be in physical contact with) electrically conductive interconnects (e.g., vias, traces, lines, etc.) of MTJ device 1000. Although any electrically conductive material may be used for first and second electrodes 10, 70, in some embodiments, a metal such as tantalum (Ta), titanium (Ti), tungsten (W), or a composite or alloy of these elements (e.g., tantalum-nitride alloy) may be used. In some embodiments, first and/or second electrodes 10, 70 may be eliminated, and MTJ bit 200 may be in direct contact with a metallization structure (e.g., line, via, etc.) of MTJ device 1000. In some embodiments, first electrode 10 may include a seed layer at its interface with the overlying region (e.g., fixed region 20). During fabrication, the seed layer may assist in the formation of the overlying region on electrode 10.

As illustrated in FIG. 1A, MTJ bit 200 may include a fixed region 20 and a free region 40 above first electrode 10 with an intermediate region 30 disposed between fixed and free regions 20, 40. As previously explained, fixed region 20 is the fixed magnetic region and free region 40 is the free magnetic region of MTJ bit 200. That is, a magnetic moment vector in fixed region 20 does not move significantly in response to applied magnetic fields (e.g., an external field) or applied currents used to switch the magnetic moment vector of free region 40. Fixed region 20 may include a ferromagnetic alloy that includes cobalt (Co) and/or iron (Fe) and other materials (e.g., cobalt (Co), iron (Fe), and boron (B)). Fixed region 20 may include a single layer or multiple layers stacked one on top of another. In some embodiments, fixed region 20 may include one or more ferromagnetic layers and one or more non-magnetic material layers (e.g., ruthenium (Ru), rhodium (Rh), platinum (Pt), palladium (Pd), rhenium (Re), iridium (Ir), copper (Cu), aluminum (Al), tantalum (Ta), titanium (Ti), niobium (Nb), vanadium (V), zirconium (Zr), one or more alloys of these elements, and in certain embodiments, tungsten (W) and molybdenum (Mo)). In some embodiments, fixed region 20 may include a multi-layer structure of cobalt (Co) and platinum (Pt), cobalt (Co) and palladium (Pd), or cobalt (Co) and nickel (Ni) (with or without other alloying elements). In some embodiments, fixed region 20 may include one or more synthetic antiferromagnetic (SAF) structures or synthetic ferromagnetic (SyF) structures.

Free region 40 may also include a ferromagnetic alloy. In some embodiments, free region 40 may comprise an alloy of cobalt (Co), iron (Fe), and boron (B) (referred to as CoFeB). Free region 40 may also include multiple layers stacked one over the other. For example, free region 40 may include at least two ferromagnetic layers separated from each other by a coupling layer (formed of, for example, tantalum (Ta), tungsten (W), molybdenum (Mo), ruthenium (Ru), rhodium (Rh), rhenium (Re), iridium (Ir), chromium (Cr), osmium (Os), and combinations thereof) that provides ferromagnetic or antiferromagnetic coupling between the ferromagnetic layers on either side. Intermediate region 30 may include a dielectric material that functions as a tunnel barrier of MTJ bit 200. In some embodiments, intermediate region 30 may include an oxide material, such as, for example, Magnesium Oxide (MgO$_x$), Aluminum Oxide (AlO$_x$ (e.g., Al$_2$O$_3$)), etc.

In some embodiments, a second intermediate region 50 may be formed above free region 40. Similar to intermediate region 30, intermediate region 50 may also include a dielectric material, such as, for example, MgO$_x$, AlO$_x$ (e.g., Al$_2$O$_3$), or another oxide material. In some embodiments, the oxidation level of the oxide of intermediate region 50 may be different that the oxidation level of the oxide of intermediate region 30. In some embodiments, similar to intermediate region 30, intermediate region 50 may also function as a tunnel barrier in MTJ bit 200. However, in some embodiments, intermediate region 30 may function as a tunnel barrier and intermediate region 50 may function as a diffusion barrier of MTJ bit 200. In some embodiments, a spacer region 60 may be formed between intermediate region 50 and top electrode 70. In some embodiments, spacer region 60 may be formed of an electrically conductive non-ferromagnetic material, such as, for example, ruthenium (Ru). In some embodiments, spacer region 60 may include a multilayer stack, such as, for example, a layer of ruthenium (Ru) and one or more layers of cobalt (Co), iron (Fe), boron (B), or an alloy thereof (e.g., CoFeB). It should be noted that, in some embodiments, some of the regions (for example, first and second electrodes, 10, 70, second intermediate region 50, spacer region 60, etc.) discussed above may be eliminated from MTJ bit 200.

A spin Hall (SH) effect material may be provided on the sidewalls of MTJ bit 200 proximate free region 40 to form a spin Hall channel region, or SH channel region 100. As will explained in more detail below, SH channel region 100 may assist in switching the magnetization direction of free region 40 of MTJ bit 200. In some embodiments, as illustrated in FIGS. 1A and 1B, an insulator region 90 may separate the SH channel region 100 and the sidewall on one side of MTJ bit 200. Insulator region 90 may be formed from any electrically insulating material, such as, for example, silicon, silicon oxide, silicon nitride, magnesium oxide, aluminum oxide, etc. After SH channel region 100 is provided on MTJ bit 200, one or more encapsulant or interlayer dielectric materials (e.g., encapsulant 110) may be deposited over the MTJ bit 200. Back end of line (BEOL) processing may then be carried out to form MTJ device 1000 from MTJ bit 200. BEOL processing may include additional processing steps (such as, for example, polishing a top surface of the structure to expose a conductive region of the MTJ bit 200, forming a bit contact structure on the exposed regions of MTJ bit 200 to make electrical contact with the MTJ bit 200 (e.g., forming top contact, bond pads, bit lines, etc.) to fabricate MTJ device 1000 from one or more MTJ bits 200. Since these additional processing steps are known to those of ordinary skill in the art, they are not described herein for the sake of brevity.

In MTJ bit 200, switching the magnetization direction of free region 40 may be accomplished by driving a current pulse through SH channel region 100. The polarity of the current pulse and the polarity of the SH material of SH channel region 100 determines the direction in which the magnetic moment of free region 40 is transposed. SH material may have a positive spin Hall angle or a negative spin Hall angle. SH materials with positive spin Hall angle may be referred to herein as positive SH materials, while SH materials with negative spin Hall angle may be referred to herein as negative SH materials. It should be noted that the terms "positive" and "negative" as used in this context are relative terms only, where positive indicates that the material causes, e.g., a clockwise spin current relative to the direction of the current pulse passing through SH channel region 100, and negative indicates that the material causes, e.g., a counter-clockwise spin current relative to the direction of the current pulse through SH channel region 100. SH channel region 100 may include a positive SH material or a negative SH material.

Examples of SH materials that form SH channel region 100 include, but are not limited to, platinum (Pt), beta-tungsten (β-W), tantalum (Ta), palladium (Pd), hafnium (Hf), gold (Au), alloys including gold (e.g., AuPt, AuCu, AuW), alloys including bismuth (Bi) and selenium (Se) (e.g., Bi$_2$Se$_3$ or (BiSe)$_2$Te$_3$), alloys including copper (Cu) and one or more of platinum (Pt), bismuth (Bi), iridium (Ir), or lead (Pb) (e.g., CuPt alloys, CuBi alloys, CuIr alloys, CuPb alloys), alloys including silver (Ag) and bismuth (Bi) (e.g., AgBi alloys), alloys including manganese (Mn) and one or more of platinum (Pt), iridium (Ir), palladium (Pd), or iron (Fe) (e.g., PtMn alloys, IrMn alloys, PdMn alloys, FeMn alloys), or combinations thereof. In one or more embodiments, platinum (Pt), palladium (Pd), gold (Au), alloys including bismuth (Bi) and selenium (Se), CuIr alloys, and CuPt alloys may act as a positive SH material, while beta-tungsten (β-W), tantalum (Ta), hafnium (Hf), CuBi alloys, CuPb alloys, and alloys including silver (Ag) and bismuth (Bi) alloys may act as a negative SH material. In some embodiments, an SH material may act as either a positive SH material or a negative SH material depending on the mode and manner of deposition.

A current through SH channel region 100 results in a spin torque acting on free region 40 due to the injection of a spin current into free region 40 from the spin-dependent scattering of electrons in SH channel region 100. The spin current is injected into free region 40 in a direction perpendicular to the boundary (or interface) of free region 40 and SH channel region 100, and orthogonal to the direction of the current flow. The spin torque applied to free region 40 by the spin current impacts the magnetic state of free region 40. The direction of torque applied by the spin current is dependent on the direction of the current flow in SH channel region 100. Accordingly, free region 40 may be switched between two stable states as a result of the spin torque applied by a current flowing in SH channel region 100 in one direction or the other. In some embodiments, the torque applied by the spin current (i.e., SOT current) alone is used to switch free region 40 between two stable magnetic states. In some embodiments, free region 40 may be switched by the torque resulting from both an STT write current flowing through MTJ bit 200 (e.g., from first electrode 10 to second electrode 70 or vice versa) and the spin torque resulting from a spin current through SH channel region 100. In such embodiments, the spin current works as an "assist" to reduce the magnitude of the STT write current required to switch free region 40.

As a person of ordinary skill in the art would recognize, there are many techniques that may be used to detect or sense the resistance of MTJ bit 200. In some embodiments, a read current may be directed through MTJ bit 200 to detect the resistance of MTJ bit 200. The detected resistance may be compared with a reference resistance to determine the magnetic state of free region 40. In some embodiments, a self-referenced read operation is performed where the resistance through MTJ bit 200 is sensed, then MTJ bit 200 is written (or reset) so that free region 40 is in a known state, then the resistance is sensed again and compared with the resistance originally sensed. The original state of free region 40 may then be determined based on whether the resistance has changed based on the write or reset operation. In still other embodiments, a mid-point reference read operation may be performed. In some embodiments, SH channel region 100 is discontinuous between insulator region 90 and encapsulant 110 on XY plane so that the writing current flows through only one spin Hall channel path from one electrode at −Y position (not shown) to another electrode at +Y position (not shown).

The configuration of the magnetoresistive stack 150 (of MTJ bit 200) illustrated in FIG. 1A is only exemplary, and many other configurations are possible. U.S. Pat. Nos. 8,686,484; 8,747,680; 9,023,216; 9,136,464; and 9,419,208, and U.S. Patent Application Publication Nos. 2018/0158498; 2019/0165253; 2019/0173004; 2019/0131519; 2019/0140167; and 2019/0157549 describe exemplary magnetoresistive stacks that may be used for MTJ bit 200. The structure of MTJ bit 200 illustrated in FIG. 1B is also exemplary. For example, although FIG. 1B illustrates insulator region 90 as extending over an angle θ of about 180° around MTJ bit 200, this is only exemplary. In some embodiments, insulator region 90 may extend over a smaller or a larger angle.

FIGS. 2A and 2B illustrate schematic cross-sectionals views in the XZ and XY planes, respectively, of another exemplary MTJ bit 200' of an MTJ device 1000'. As explained previously, in some embodiments, MTJ bit 200' may be formed atop a via 8 having a size (e.g., diameter) larger than MTJ bit 200'. Since the different regions (i.e., regions 10-90) of MTJ bit 200' (see FIG. 2A-2B) are the same as the different regions of MTJ bit 200, for the sake of brevity, they will not be described again. In contrast to a single insulator region 90 (i.e., an insulator region 90 that spans an angular range) on the sidewall of MTJ bit 200 (see FIG. 1B), in MTJ bit 200' two insulator regions 90 may be provided on the sidewall. See FIG. 2B. In some embodiments, the two insulator regions 90 may be provided on opposite sides of the sidewall of MTJ bit 200', e.g., spaced from one another by approximately 180°. However, this is not a requirement and the different insulator regions 90 may be provided anywhere on the sidewall of MTJ bit 200'. In general, any number of insulator regions 90 may be spaced around the sidewall. In some embodiments, these multiple insulator regions 90 may be substantially equally spaced apart from each other. With reference to FIG. 2B, the two insulator regions 90 on opposite sides of MTJ bit 200' may extend around MTJ bit 200' by the same angle or by different angles. That is, $\theta_1$ may be substantially equal to $\theta_2$, or $\theta_1$ may be less than or greater than $\theta_2$. In some embodiments, SH channel region 100 is discontinuous at the right side or the left side on XY plane so that the writing current flows through only one spin Hall channel path 100 from one electrode at −Y position (not shown) to another electrode at +Y position (not shown).

Exemplary methods of fabricating a magnetoresistive device (e.g., magnetoresistive device 1000, 1000') of the current disclosure will now be described. For the sake of brevity, conventional techniques related to semiconductor processing may not be described in detail herein. The exemplary embodiments may be fabricated using known lithographic processes. The fabrication of integrated circuits, microelectronic devices, micro electro mechanical devices, microfluidic devices, and photonic devices involves the creation of several layers or regions (i.e., comprising one or more layers) of materials that interact in some fashion. One or more of these regions may be patterned so various regions of the layer have different electrical or other characteristics, which may be interconnected within the region or to other regions to create electrical components and circuits. These regions may be created by selectively introducing or removing various materials. The patterns that define such regions are often created by lithographic processes. For example, a layer of photoresist is applied onto a layer overlying a wafer substrate. A photo mask (containing clear and opaque areas) may be used to selectively expose the photoresist by a form of radiation, such as ultraviolet light, electrons, or x-rays. Either the photoresist exposed to the radiation, or not exposed to the radiation, is removed by the application of a developer. An etch may then be employed/applied whereby the layer (or material) not protected by the remaining resist is patterned. Alternatively, an additive process can be used in which a structure is built up using the photoresist as a template.

Figure 4A:
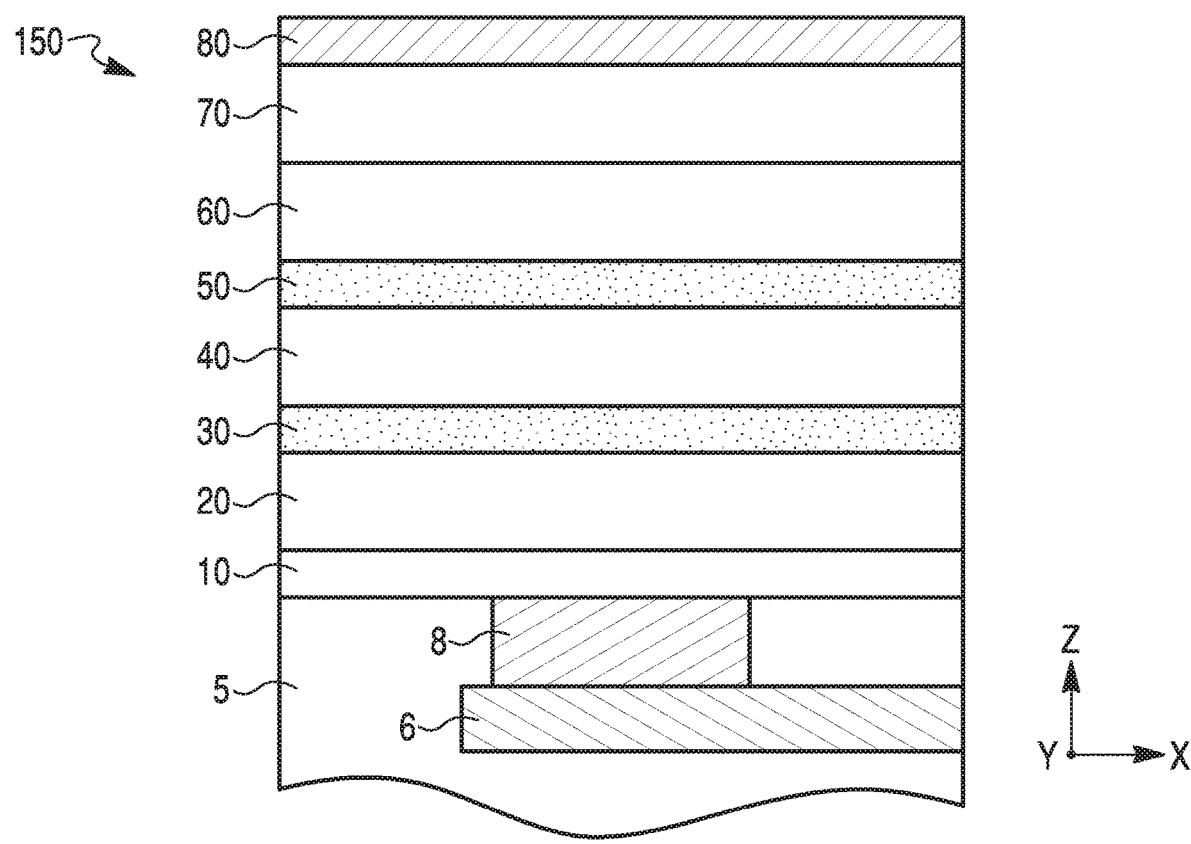

FIGS. 3A and 3B are flow charts that illustrate exemplary processing steps during the fabrication of MTJ device 1000 (of FIGS. 1A and 1B). FIGS. 4A-4K are schematic illustrations of the MTJ device 1000 (e.g., as a partially-formed MTJ device) after some fabrication steps. CMOS processing may first be carried out on a semiconductor substrate (step 310). As known to those of ordinary skill in the art, CMOS processing may include formation of transistors and/or other integrated circuit (IC) devices on a semiconductor substrate, interconnecting the formed IC devices in a desired pattern, forming metallization (bond pads, etc.) on an exposed surface of the substrate, and in some embodiments, annealing the IC devices, to form the processed semiconductor substrate 5 of FIG. 1A. A magnetoresistive stack 150 may then be formed on a surface of substrate 5 (step 320). As known to a person of ordinary skill in the art, forming the magnetoresistive stack 150 includes sequentially depositing, growing, sputtering, evaporating, and/or providing (as noted above, herein collectively "forming" or other verb tense (e.g., "form," etc.)) the various regions (regions 10-70) that form the magnetoresistive stack 150. FIG. 4A is a cross-sectional illustration of the magnetoresistive stack 150 deposited on substrate 5 having multiple electrically conductive vias 8 (only one shown) formed thereon. As explained previously, via 8 may be electrically connected to CMOS circuitry or devices formed on (or in) substrate 5. Any now-known (e.g., chemical vapor deposition, sputter deposition, etc.) or future developed process of depositing materials (e.g., physical vapor deposition, chemical vapor deposition, sputtering, etc.) may be used to form magnetoresistive stack 150. In some embodiments, techniques such as, for example, ion beam deposition (IBD), atomic layer deposition (ALD), etc. may be used to deposit the various regions. Since these deposition techniques are known in the art, they are not described herein.

As illustrated in FIG. 4A, in some embodiments, a hardmask region 80 may also be deposited as the top layer of magnetoresistive stack 150. The hardmask region 80 may assist with subsequent processing (e.g., etching, patterning, etc.) of magnetoresistive stack 150 to form MTJ bit 200. Any material that is more resistant to the etch process used to the etch the underlying regions than these etched regions may be used to form hardmask region 80. Although not a requirement, in some embodiments, hardmask region 80 may be formed using one or more metals. For example, in some embodiments, hardmask region 80 may include one or more noble metals and/or alloys thereof, for example, alloys of a noble metal with transition metals (e.g., platinum (Pt), Iridium (Ir), molybdenum (Mo), tungsten (W), ruthenium (Ru), and/or alloy AB (where A=platinum (Pt), Iridium (Ir), molybdenum (Mo), tungsten (W), or ruthenium (Ru), and B=iron (Fe), nickel (Ni), or manganese (Mn)). Hardmask region 80 may be sufficiently selective (to the etch process), or relatively inert, to the etch process used to etch the regions of material under the hardmask region 80. Although not illustrated in FIG. 1A, in some embodiments, after etching of the magnetoresistive stack 150 to form MTJ bit 200, at least a portion of the hardmask region 80 may be retained over second electrode 70. In some embodiments, this retained portion of hardmask region 80 may be stripped after forming MTJ bit 200. However, in some embodiments (e.g., where hardmask region 80 includes a metal of sufficient electrical conductivity), the hardmask region 80 above second electrode 70 may be retained in the MTJ bit 200 and form a part of the top electrically conductive electrode of MTJ bit 200.

Optionally, in some embodiments, after depositing the various regions of the magnetoresistive stack, the formed magnetoresistive stack 150 may be annealed (step 330). As known to those of ordinary skill in the art, annealing magnetoresistive stack 150 may set the magnetic domains of the different regions of magnetoresistive stack 150 in the desired directions. Annealing may be performed by exposing magnetoresistive stack 150 to a relatively high temperature, e.g., between about 300-500° C.). In some embodiments, magnetoresistive stack 150 may also be subject to a magnetic field during the high temperature annealing process. In some embodiments, step 330 (annealing) may be eliminated.

Figure 4B:
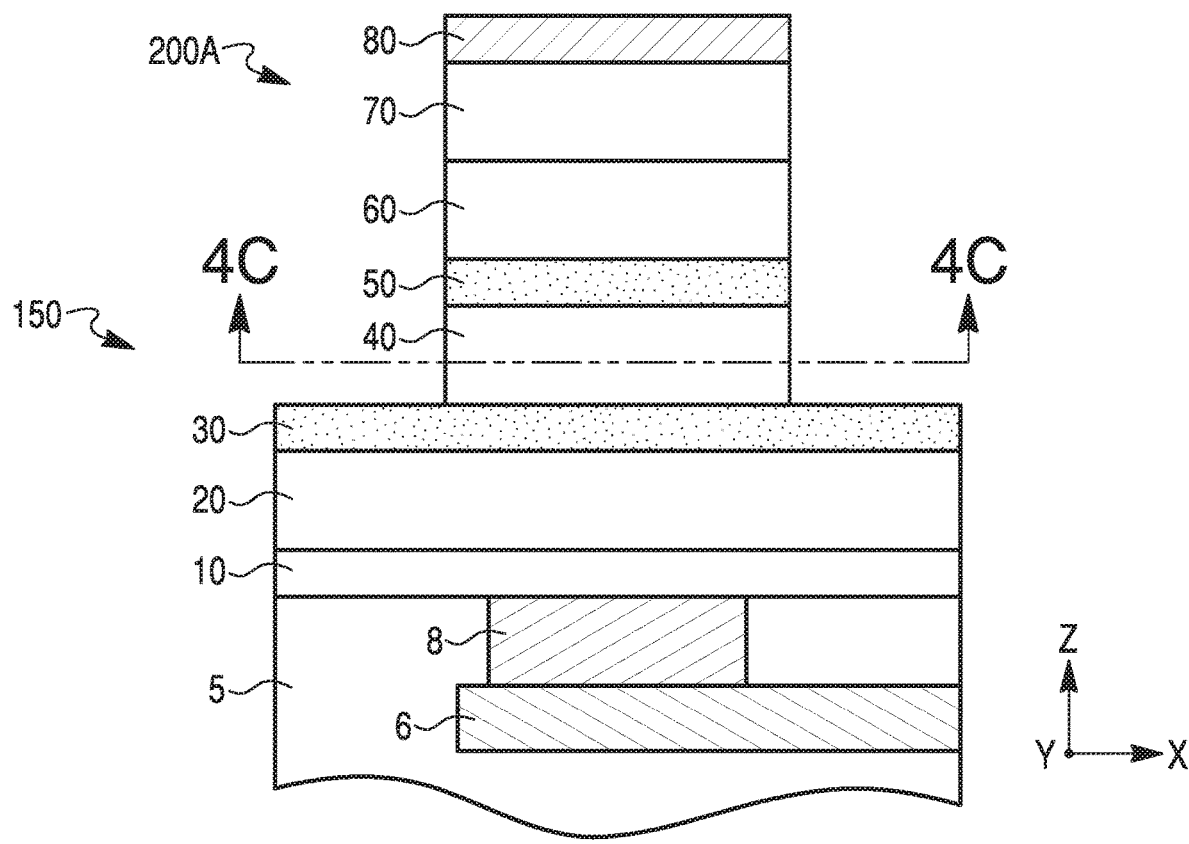
Figure 4C:
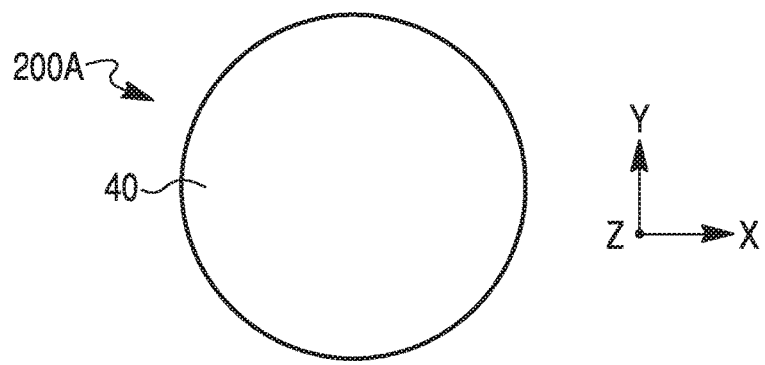

The magnetoresistive stack 150 may then be etched (step 340) in one or more etching steps. In some embodiments, as illustrated in FIG. 4B, in step 340, the magnetoresistive stack 150 may be etched through free region 40 to form an array of partially formed MTJ bits 200A spaced apart from each other. It should be noted that only one partially formed MTJ bit 200A will be illustrated in the figures of the present application. FIG. 4C illustrates a cross-sectional view of the partially formed MTJ bit 200A in an XY plane (through region 40). Any now-known (e.g., sputter etching, ion beam etching (IBE) or milling, reactive ion beam etching (RIE) or milling, etc.) or later developed etching process may be used to etch through the different regions (e.g., regions 70, 60, 50, & 40) of the magnetoresistive stack 150. In some embodiments, step 340 may include depositing a photo resist on (or above) the hardmask region 80 and patterning the photoresist (e.g., using lithographic techniques) to expose areas of the hardmask region 80 corresponding to the desired dimensions of the MTJ bits 200. The hardmask region 80 may then be etched using a suitable etching technique to transfer the photo resist pattern to hardmask region 80 (e.g., to remove hardmask region 80 from the exposed areas). The multiple regions (e.g., regions 70, 60, 50, & 40) of the magnetoresistive stack 150 may then be etched (using, for e.g., RIE, IBE, etc.) with hardmask region 80 "protecting" or masking the areas covered by the remaining portions of hardmask region 80. As known to those of ordinary skill in the art, IBE and RIE use beams of charged ions (comprising one or more of Argon, Krypton, Xenon, etc.) to etch through multiple regions of the magnetoresistive stack 150. The impact of the ions ablates the areas of the magnetoresistive stack 150 not covered by hardmask region 80.

Although not a requirement, in some embodiments, the etch process (i.e., step 340) may be stopped at the interface of intermediate region 30 with free region 40. In some embodiments, the etch process may be terminated within free region 40 (or another region) proximate the interface of free region 40 with intermediate region 30. Any known process may be used to terminate the etch process at a desired location. In some embodiments, the etch process (i.e., step 340) may be time and/or endpoint controlled or monitored. In one embodiment, the etch process may be stopped when endpoint monitoring detects the presence or absence of a predetermined material (or a combination of materials) at the bottom of the etched-region. For example, the etch process may be terminated upon detecting the material (e.g., a dielectric material) of intermediate region 30 to stop the etch at the interface of free region 40 and intermediate region 30. The presence of material corresponding to intermediate region 30 may be detected during etching by any suitable mechanism. In some embodiments, the material of intermediate region 30 may be detected based on optical emission spectra (OES). That is, the etch process may be terminated when a rise in OES signal for the material of intermediate region 30 is detected. Here, the etch process terminates at the beginning of intermediate region 30 before significant etching of intermediate region 30 occurs. In some embodiments, however, the etch process may be terminated when a significant drop in OES signal of the material(s) corresponding to free region 40 (i.e., the region above intermediate region 30) is detected. Here, the etch process terminates immediately above intermediate region 30. In some embodiments, the etch process may be continued for a limited (or otherwise predetermined) duration after etching of region 40 (or region 30) begins so as to terminate the etching process within region 40 (or region 30).

It should be noted that, although the etch process of step 340 is described as being terminated after etching region 40, this is only exemplary. In general, the etching (i.e., step 340) may be terminated anywhere along the magnetoresistive stack 150. For example, in some embodiments, the etching of step 340 may be terminated after etching region 60, or region 50, or region 30, or region 20, or region 10.

Figure 4D:
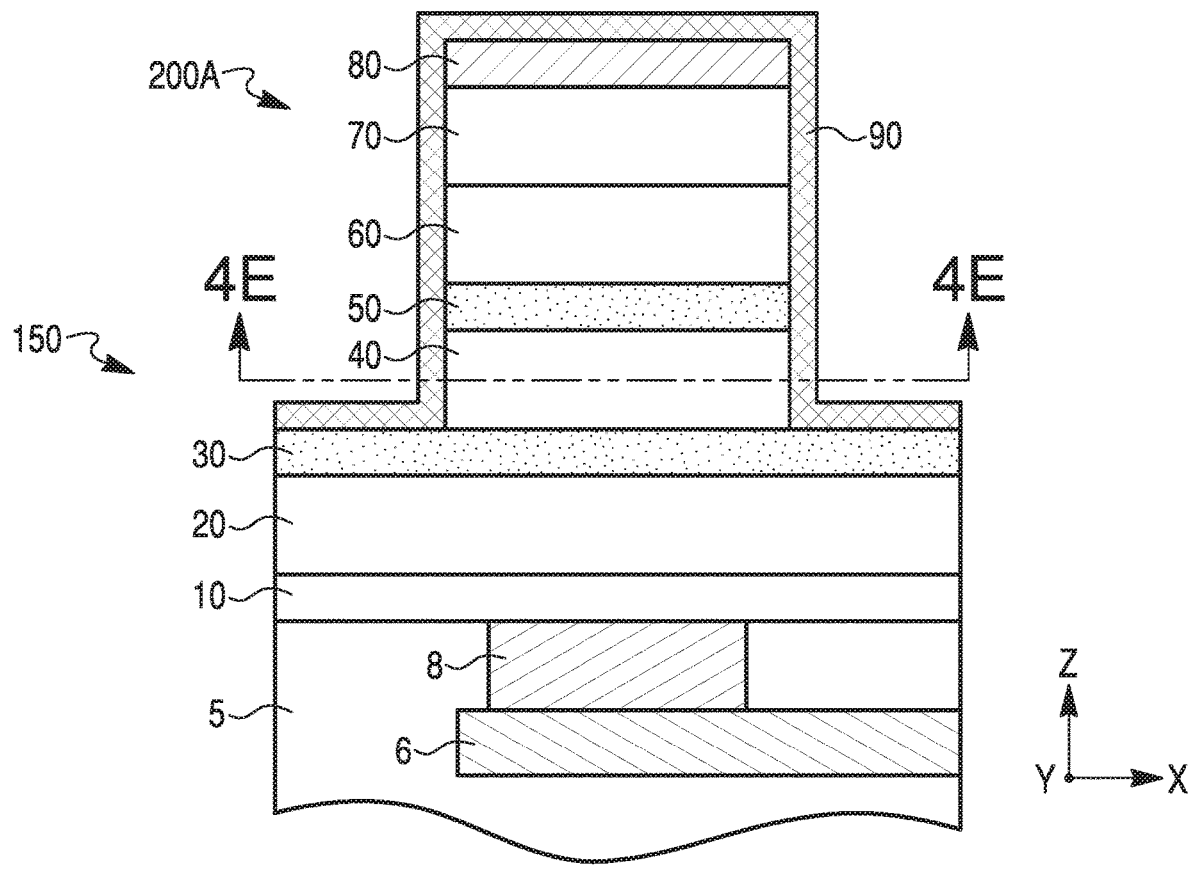
Figure 4E:
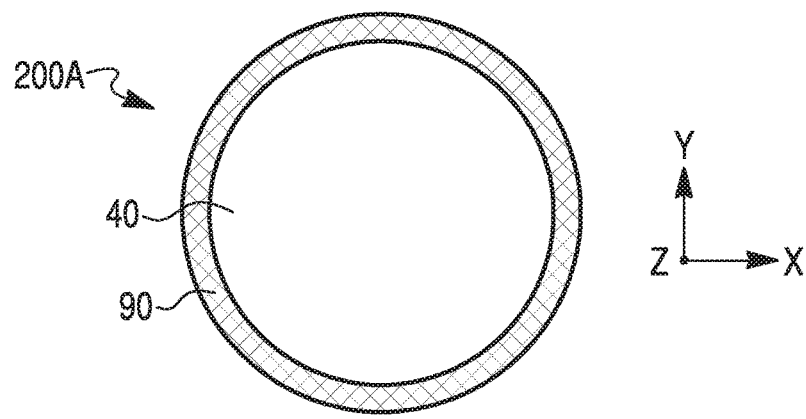
Figure 4F:
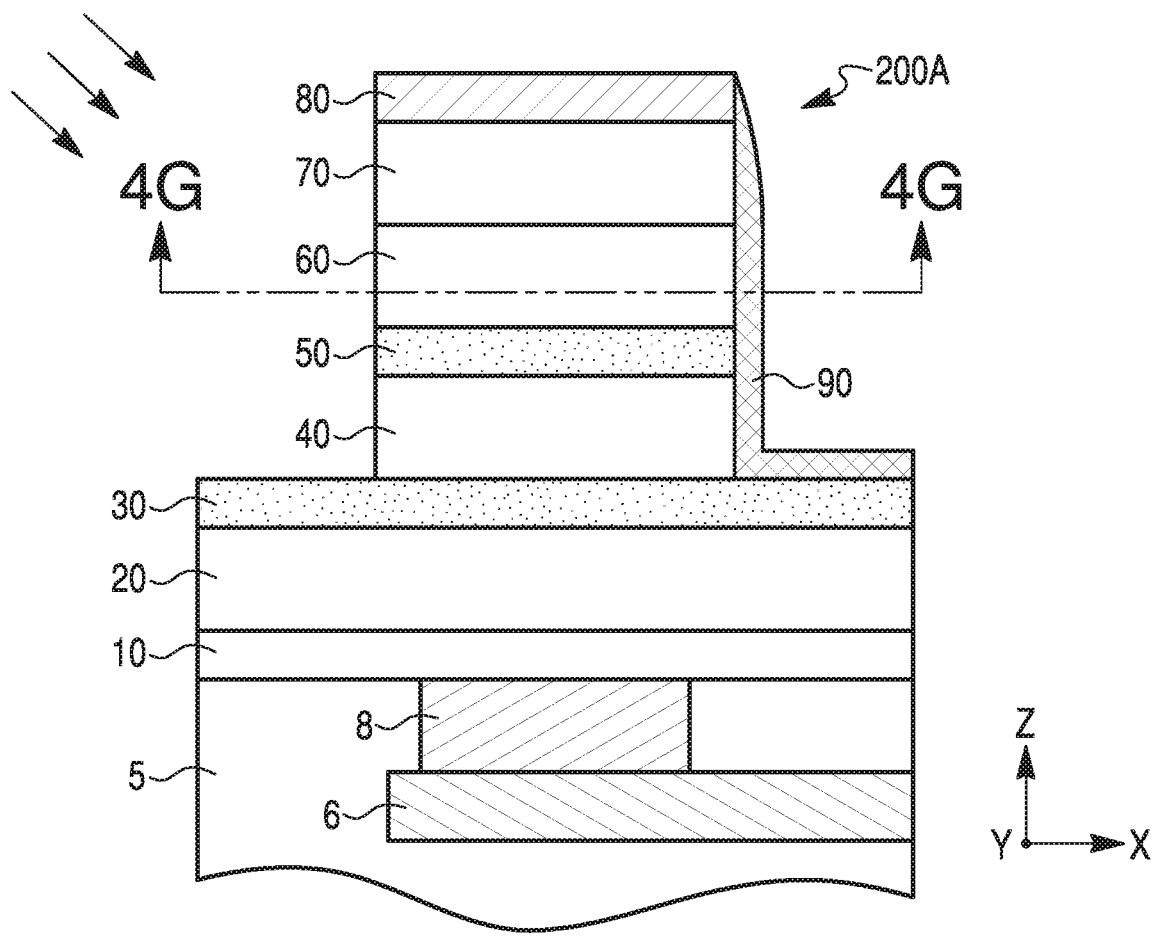
Figure 4G:
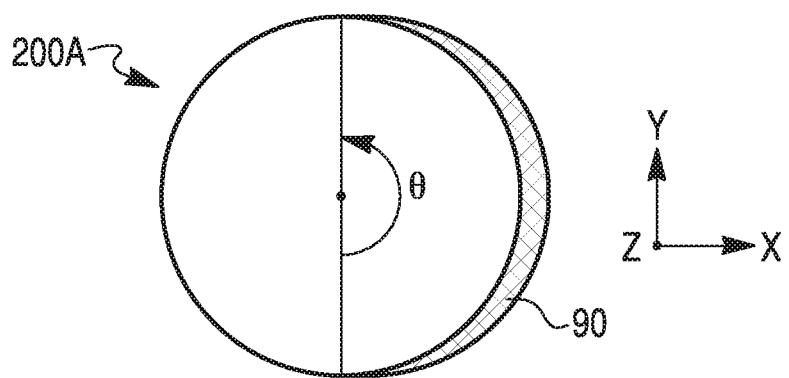

After forming an array of partially formed MTJ bits 200A in step 340, an electrically insulating material (e.g., silicon, silicon oxide, silicon nitride, magnesium oxide, aluminum oxide, etc.) may be deposited over these partially formed MTJ bits 200A (step 350) to form insulator region 90, which may serve to encapsulate the partially formed MTJ bits 200A. Any suitable technique may be used to deposit the insulating material. FIG. 4D is a cross-sectional illustration of a partially formed MTJ bit 200A in the XZ plane after the insulator region 90 is formed. And, FIG. 4E is a cross-sectional illustration of a partially formed MTJ bit 200A in the XY plane. In some embodiments, as illustrated in FIG. 4D, the deposited insulating material may form a conformal coating over the partially formed MTJ bit 200A. The insulator region 90 may then be etched from a portion (e.g., one side) of the partially formed MTJ bits 200A (step 360). FIG. 4F is a cross-sectional view in the XZ plane of the partially formed MTJ bit 200A after etching the insulator region 90 from one side, and FIG. 4G is a cross-sectional view of the partially formed MTJ bit 200A in the XY plane. In some embodiments, the insulator region 90 from a portion (e.g., one side) of the partially formed MTJ bits 200A may be etched, for example, by an IBE process. As those of ordinary skill in the art will understand, etching via an IBE process may involve rotating the surface to be etched so as to ensure uniform etching of all desired surfaces. However, the principles of the present disclosure contemplate etching insulator region 90 from only a portion of partially formed MTJ bit 200A without rotating the partially formed MTJ bit 200A. Stated differently, by refraining from rotating the partially-formed MTJ bit 200A, the IBE process is only permitted to etch a portion of insulator region 90. In some embodiments, as illustrated by arrows in FIG. 4F, the ions impact the surface of the partially formed MTJ bits 200A at an angle. The impact of the ions ablates the material of the insulator region 90. If IBE is performed without rotating substrate 5, the geometry of the partially formed MTJ bits 200A will shield one side of these bits 200A from the ions, and prevent the removal of the insulator region 90 from that side.

Figure 4H:
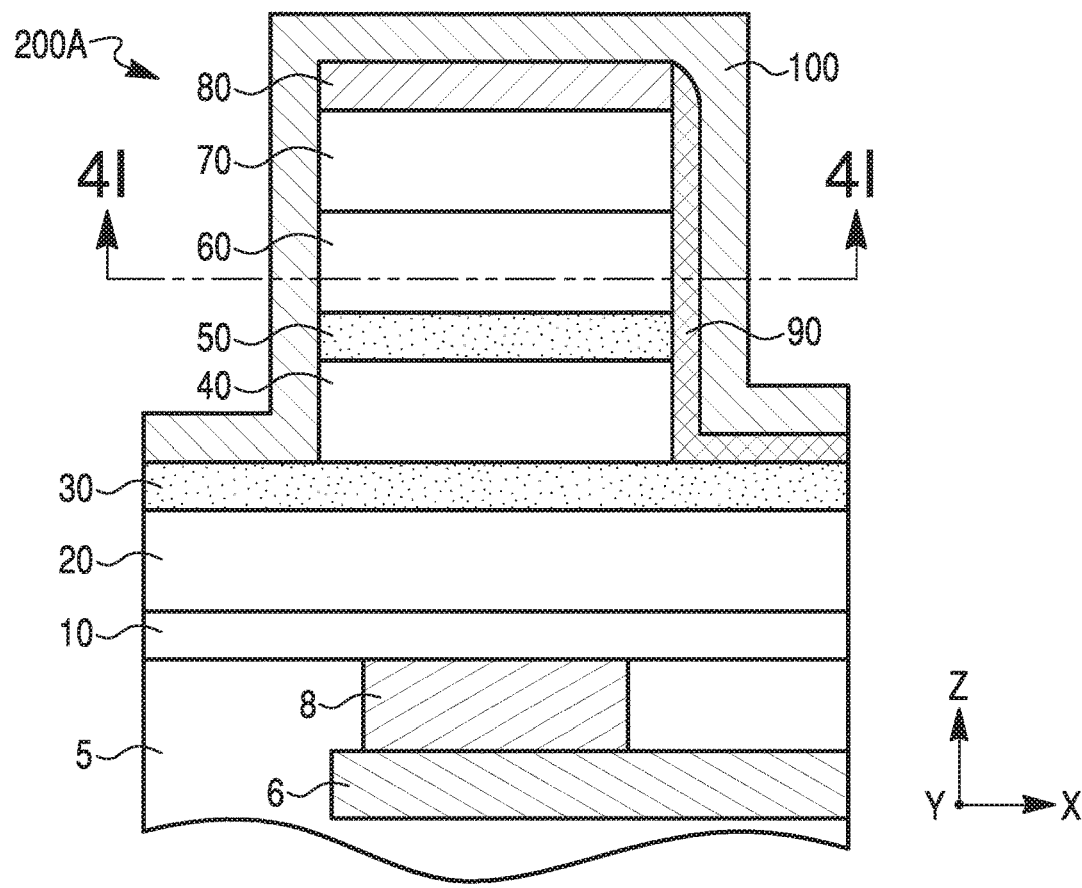
Figure 4I:
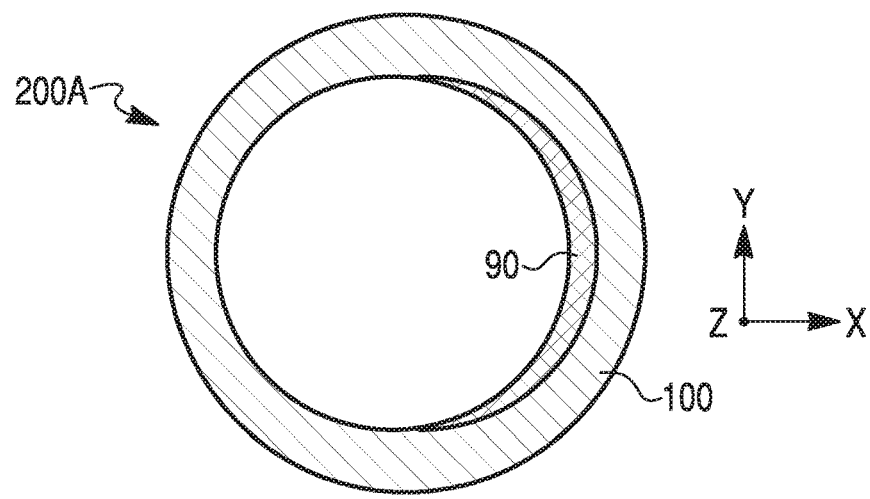

An SH material may then be deposited over the partially formed MTJ bits 200A and the insulator region 90 to form SH channel region 100 (step 370). FIG. 4H illustrates a cross-sectional view of the partially formed MTJ bit 200A in the XZ plane after depositing the SH material, and FIG. 4I illustrates a cross-sectional view of the partially formed MTJ bit 200A in the XY plane. Any suitable deposition technique (such as, for example, ion beam deposition (IBD), atomic layer deposition (ALD), or other suitable techniques may be used to form SH channel region 100. After forming SH channel region 100 (step 370), the remaining regions of the magnetoresistive stack 150 may be etched to convert the partially formed MTJ bit 200A to a fully patterned MTJ bit 200 (step 380).

Figure 4J:
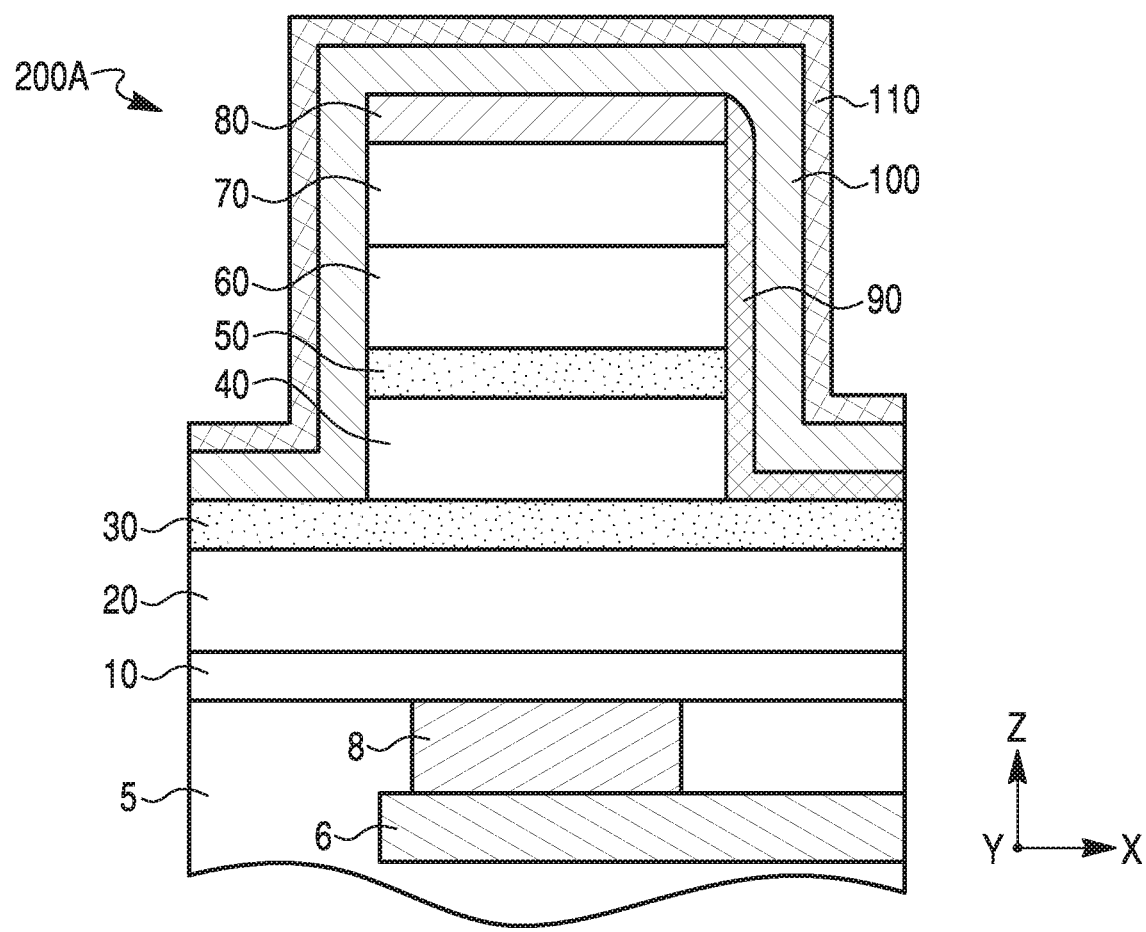

In some embodiments, step 380 may include depositing an encapsulant 110 over the partially formed MTJ bit 200A and the SH channel region 100 (step 390). FIG. 4J illustrates a cross-sectional view of the partially formed MTJ bit 200A in the XZ plane after depositing the encapsulant 110. Encapsulant 110 may be any electrically insulating material. In some embodiments, encapsulant 110 may be the same as, or similar to, the material of insulator region 90. The remaining regions of the magnetoresistive stack 150 (i.e., regions 10, 20, and 30) may then be etched (step 400) to form MTJ bit 200. Any known etching process (IBE, RIE, etc.) may be used for the etching in step 400. FIG. 4K illustrates a cross-sectional view of the MTJ bit 200 in the XZ plane after step 400. During step 400, the coating of encapsulant 110 on the sidewalls of the partially formed MTJ bit 200A may protect the sidewalls from additional etching. After the etching (step 400), as illustrated in FIG. 4K, in some embodiments, a portion of the hardmask region 80 may be retained atop MTJ bit 200. However, this is only exemplary. In some embodiments, all of, or substantially all of region 80 may be removed after step 400. In embodiments where the electrically conductive via 8 below the MTJ bit 200 is smaller in diameter than the MTJ bit 200 (as illustrated in the embodiment of FIG. 4K), the etching of step 400 will terminate on a dielectric layer (e.g., an oxide layer) on the surface of substrate 5. In embodiments, where via 8 is larger than MTJ bit 200 (as illustrated in the embodiment of FIG. 2A), the etching of step 400 will terminate on the metal of via 8.

After forming the MTJ bit 200 (in step 400), BEOL processing may be performed and completed (step 405) e.g., prior to the magnetic fields of the fixed region 20 of the MTJ bit 200 may be set (step 410). Any process known in the art may be used to set the magnetic fields of MTJ bit 200. In some embodiments, the substrate 5 with the formed MTJ bits 200 may be subjected to a magnetic field at a high temperature to set the magnetic fields of the free layers 20 of all the MTJ bits 200 formed on substrate 5. Since field setting techniques are known in the art, they are not discussed herein. The MTJ bit 200 may be subjected to BEOL processing (i.e., step 405) to form MTJ device 1000 from the MTJ bits 200. As explained previously, BEOL processing may include additional processing steps (such as, for example, polishing a top surface of the structure to expose a conductive region (e.g., regions 70 or 80) of the MTJ bits 200, forming a bit contact structure on the exposed regions of the MTJ bits 200 to make electrical contact with these MTJ bits 200, forming interconnects around MTJ bit 200, forming top contact, bond pads, bit lines, etc.) to fabricate MTJ device 1000 from MTJ bits 200. Since these processing steps are well known to those of ordinary skill in the art, they are not described herein for the sake of brevity.

Figure 6A:
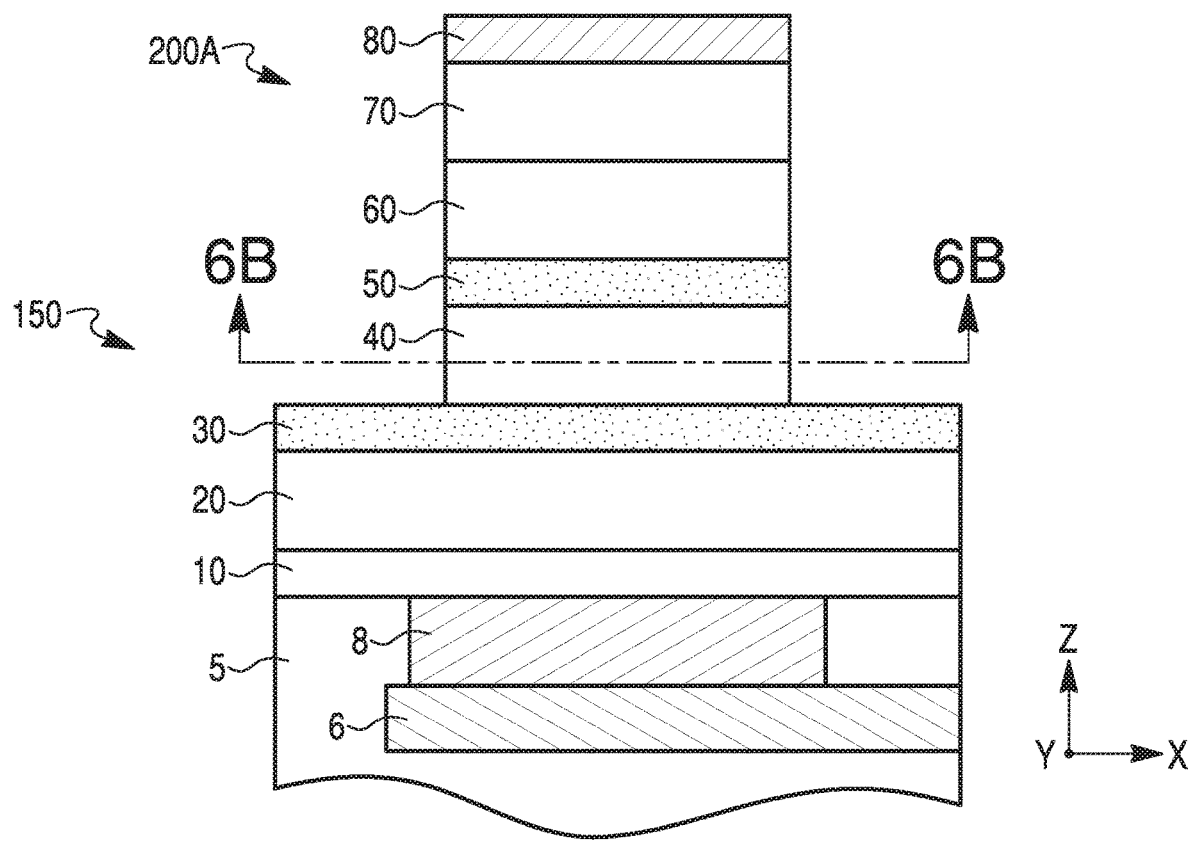
Figure 6B:
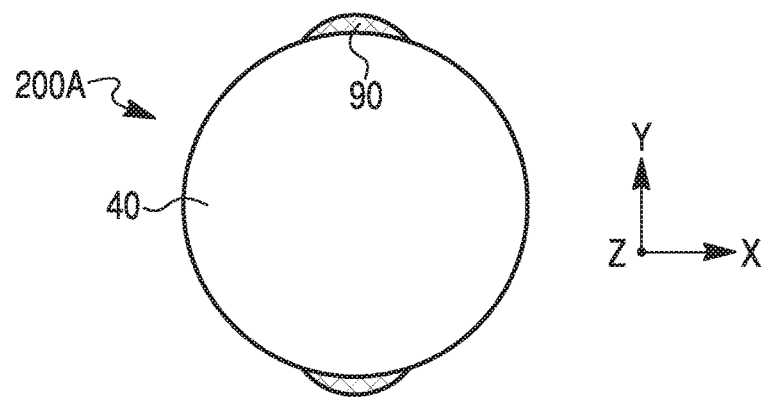
Figure 6C:
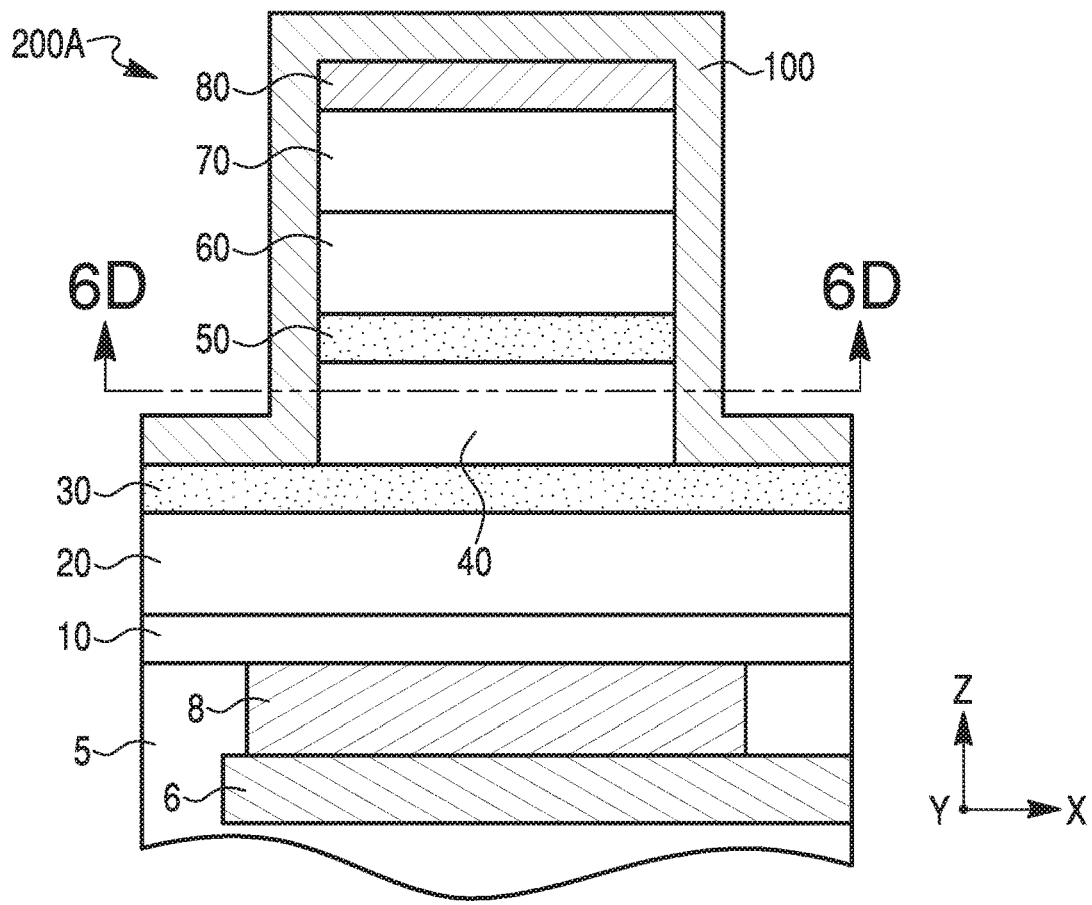
Figure 6D:
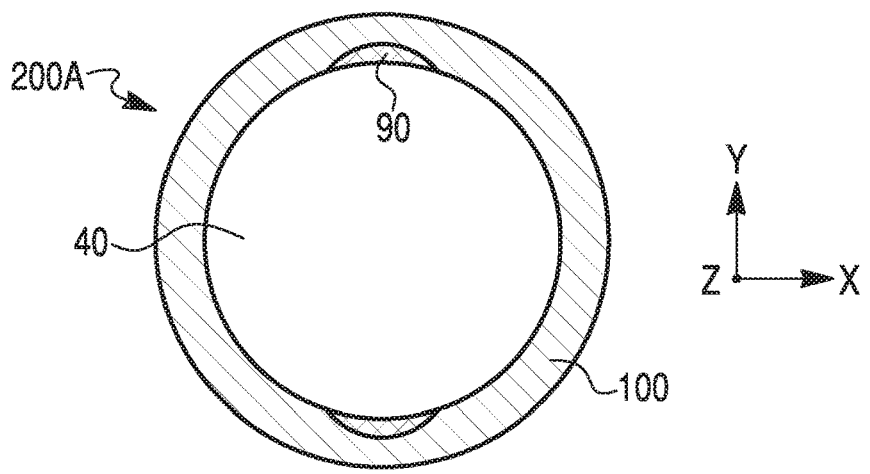
Figure 6E:
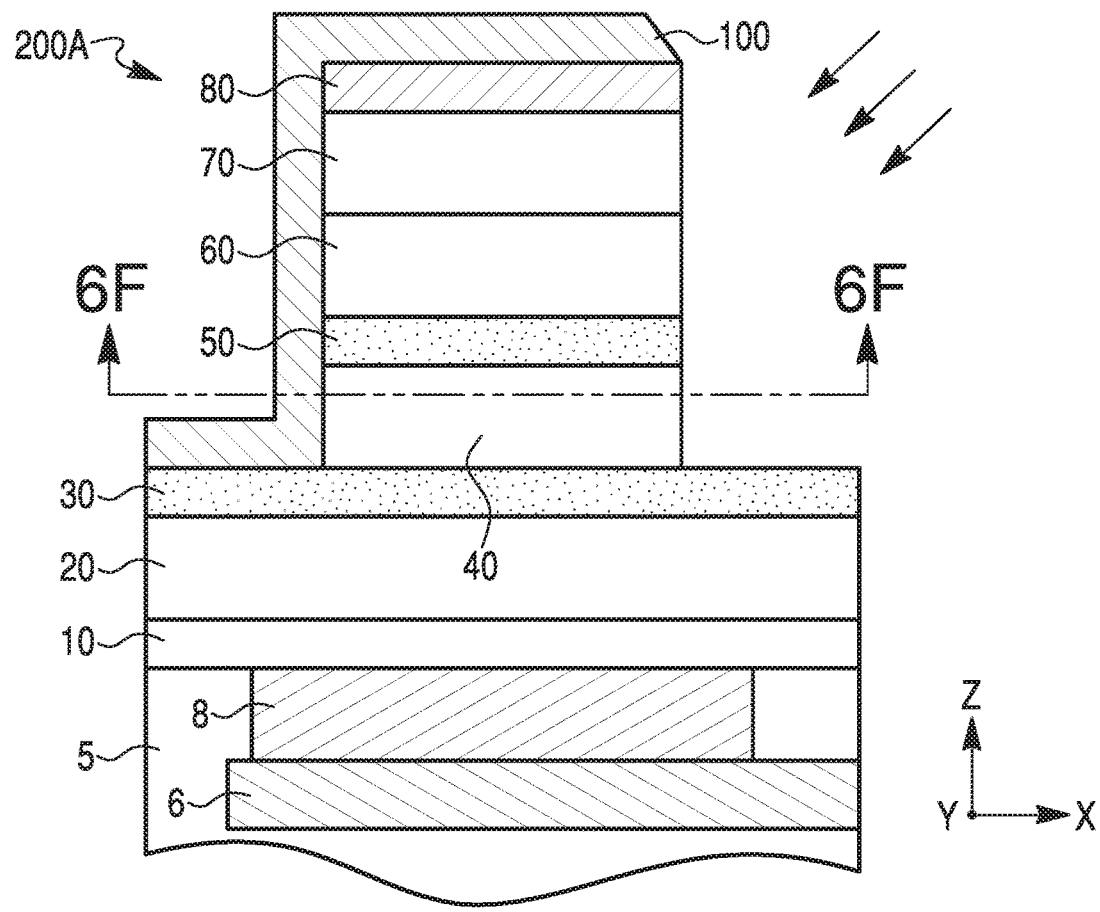
Figure 6F:
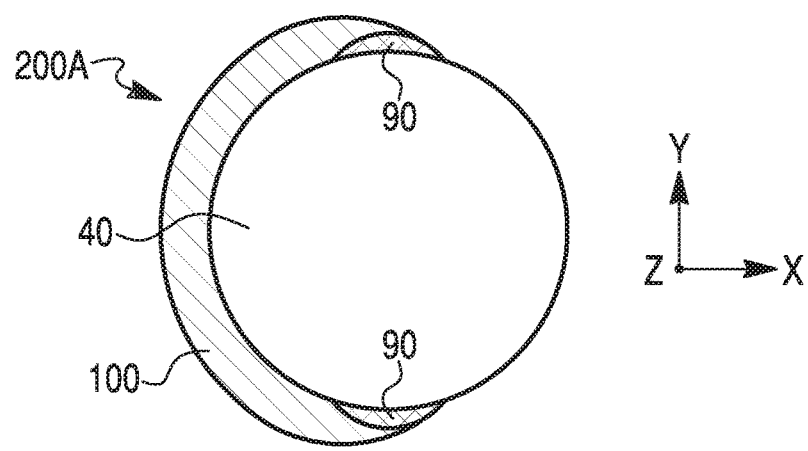

The fabrication method described with reference to FIGS. 3A and 3B may be modified to form MTJ bit 200' of FIGS. 2A and 2B. FIG. 5 is a flow chart that illustrates an exemplary fabrication method that may be used to form MTJ bit 200' of FIGS. 2A and 2B. After etching the insulator region 90 from one side of the MTJ bits 200A in step 360 (of FIG. 3), the substrate 5 may be rotated (step 510), for example, by about 180°, and the opposite side of the partially formed MTJ bits 200A may then be etched (using, for example, IBE without rotation of the substrate 5) to remove the insulator region 90 from the opposite side of the partially formed MTJ bits 200A (step 520). FIG. 6A is a cross-sectional view in the XZ plane, and FIG. 6B is a cross-sectional view in the XY plane, of the partially formed MTJ bit 200A after insulator region 90 from the opposite side is etched. As a result of the angles resulting from rotating partially formed MTJ bits 200A so as to etch from two opposing locations, portions of insulator region 90, e.g., portions in between of the two etch locations may remain on the partially formed MTJ bits 200A. For example, as shown in FIG. 6B, insulator region 90 may be retained on opposite sidewalls of the partially formed MTJ bit 200A at locations approximately in between of the two etch locations. SH material may then be deposited over the partially formed MTJ bits 200A and the insulator regions 90 to form SH channel region 100 (step 530). FIG. 6C illustrates a cross-sectional view of the partially formed MTJ bit 200A in the XZ plane after forming SH channel region 100, and FIG. 6D illustrates a cross-sectional view of the partially formed MTJ bit 200A in the XY plane. The SH channel region 100 from one side of the partially formed MTJ bits 200A may then be etched, for example, by IBE etch without rotation (step 540). FIG. 6E illustrates a cross-sectional view of the partially formed MTJ bit 200A in the XZ plane after step 540, and FIG. 6F illustrates a cross-sectional view of the partially formed MTJ bit 200A in the XY plane. In some embodiments relating to FIG. 6F, the writing current flows through SH channel region 100 from one electrode at −Y position (not shown) to another electrode at +Y position (not shown), and the two insulator regions 90 reduce a sneak current flowing through the free region 40 so that high switching efficiency is obtained. The remaining regions of the magnetoresistive stack 150 may then be etched to convert the partially formed MTJ bits 200A to MTJ bits 200' (step 550). Step 550 may include processing operations similar to those described with reference to step 380 (of FIG. 3B) and illustrated in FIGS. 4H-4K. For example, in some embodiments, step 550 may include depositing an encapsulant (similar to encapsulant 110) over the partially formed MTJ bits 200A and etching the remaining regions of the magnetoresistive stack 150 below MTJ bits 200A to complete the MTJ bit 200'. The encapsulant covering the sidewalls of the partially formed MTJ bits 200A may protect the sidewalls from etching. For the sake of brevity, these operations are not described again. BEOL processing (step 560) may then be performed and completed to form MTJ device 1000' from the MTJ bits 200'. Field setting (step 570) may then be performed to set the magnetic fields of the MTJ bit 200'.

It should be noted that the embodiments described and illustrated above are only exemplary and many modifications are possible. For example, although specific processing steps are described with reference to steps 380 and 550 above, this is only exemplary. In general, the partially formed MTJ bits 200A may be converted to MTJ bits 200 or 200' in any manner. In some embodiments, MTJ bits 200, 200' may be fabricated such that the formed SH channel region 100 is not in physical contact with intermediate region 30. For example, while etching the magnetoresistive stack 150 to form the partially formed MTJ bits 200A in step 340 (of FIGS. 3A, 3B, and 4B), the etching may be stopped within free region 40 (e.g., before the interface of free region 40 with intermediate region 30). In such embodiments, the formed SH channel region 100 (in step 370 of FIG. 4 and step 530 of FIG. 5) will not be in contact with intermediate region 30.

It should be noted that, although MTJ bits 200 and 200' are illustrated as having a circular cross-section in the XY plane (see, for example, FIGS. 1B and 2B), this is only exemplary. In general, the MTJ bits 200 and 200' may have any cross-sectional shape. With reference to FIG. 1B, in some embodiments, MTJ bit 200 (or MTJ bit 200') may have an elliptical cross-sectional shape with its major axis (or long axis) aligned along the X-axis or the Y-axis. In some embodiments of an elliptical MTJ bit 200, the major axis may be aligned along the Y-axis and the minor axis may be aligned along the X-axis so that maximum spin current flows across the free region 40 in the X-direction.

As alluded to above, the MTJ devices 1000, 1000' (formed using MTJ bits 200, 200') may include a sensor architecture or a memory architecture (among other architectures). For example, in an MTJ device having a memory configuration, the MTJs may be electrically connected to an access transistor and configured to couple or connect to various conductors, which may carry one or more control signals, as shown in FIG. 7. The MTJ devices 1000, 1000' may be used in any suitable application, including, e.g., in a memory configuration. In such instances, the MTJ devices 1000, 1000' may be formed as integrated circuits comprising a discrete memory device (e.g., as shown in FIG. 8A) or an embedded memory device having a logic therein (e.g., as shown in FIG. 8B), each including MRAM, which, in one embodiment is representative of one or more arrays of MRAM having a plurality of magnetoresistive stacks/structures, according to certain aspects of certain embodiments disclosed herein.

In one embodiments, a magnetoresistive device is disclosed. The device includes a magnetically fixed region, a magnetically free region positioned above or below the magnetically fixed region, and an intermediate region positioned between the magnetically fixed region and the magnetically free region. The magnetoresistive device may also include a spin Hall channel region extending at least partially around a sidewall of at least the magnetically free region and an insulator region extending around a portion of the sidewall such that (a) the insulator region contacts a first portion of the sidewall and (b) the spin Hall channel region contacts a second portion of the sidewall.

Various embodiments of the disclosed magnetoresistive device may additionally or alternatively also include one or more of the following features: the sidewall may have a substantially circular or a substantially elliptical cross-sectional shape; the first portion of the sidewall may extend over an angle of about 180° and the second portion of the sidewall may extend over an angle of about 180°; the first portion of the sidewall may include multiple regions equally spaced apart around the sidewall and the second portion of the sidewall may include remaining regions of the sidewall; the first portion of the sidewall and the second portion of the sidewall may be opposite sides of the sidewall; the first portion of the sidewall may include two spaced apart and oppositely positioned first regions of the sidewall, and the second portion of the sidewall may include a portion of the sidewall extending between the two first regions on one side of the sidewall; the spin Hall channel region may be formed of a positive spin-Hall material; the spin Hall channel region may be formed of a negative spin-Hall material; and the insulator region may be formed of at least one of silicon, silicon oxide, silicon nitride, magnesium oxide, or aluminum oxide.

In another embodiment, a magnetoresistive device is disclosed. The magnetoresistive device may include a magnetically fixed region, a magnetically free region positioned above or below the magnetically fixed region, and an intermediate region positioned between the magnetically fixed region and the magnetically free region. A spin Hall channel region may extend at least partially around a sidewall of at least a portion of the magnetically free region, wherein the sidewall may have one of a substantially circular or a substantially elliptical cross-sectional shape. An insulator region may extend around a portion of the sidewall such that (a) the insulator region contacts a first portion of the sidewall and (b) the spin Hall channel region contacts a second portion of the sidewall. The first portion of the sidewall may extend over an angle of about 180o, and the second portion of the sidewall may extend over an angle of about 180o.

Various embodiments of the disclosed magnetoresistive device may additionally or alternatively also include one or more of the following features: the spin Hall channel region may be formed of a positive spin-Hall material; the spin Hall channel region may be formed of a negative spin-Hall material; the insulator region may be formed of at least one of silicon, silicon oxide, silicon nitride, magnesium oxide, or aluminum oxide; and the spin Hall channel region may extend at least partially around the sidewall of at least a portion of the magnetically free region and the magnetically fixed region.

In another embodiment, a method of fabricating a magnetoresistive device is disclosed. The method may include forming a magnetoresistive stack on a substrate, wherein the magnetoresistive stack includes a magnetically fixed region, a magnetically free region, and an intermediate region positioned between the magnetically fixed region and the magnetically free region. The method may also include (b) etching at least a portion of the magnetoresistive stack to form a sidewall on at least a portion of the magnetically free region, and (c) after step (b), depositing an insulator on at least the sidewall. The method may further include (d) after step (c), etching at least a portion of the deposited insulator to expose a portion of the sidewall, and (e) after step (d), depositing a spin-Hall material such that (i) the insulator contacts a first portion of the sidewall and (b) the spin-Hall material contacts a second portion of the sidewall.

Various embodiments of the disclosed method may also include one or more of the following features: the etching in step (d) may include Ion Beam Etching (IBE) without rotation of the substrate; the sidewall may have a substantially circular or a substantially elliptical cross-sectional shape, wherein the first portion of the sidewall extends over an angle of about 180o, and the second portion of the sidewall extends over an angle of about 180o; the sidewall may have a substantially circular or a substantially elliptical cross-sectional shape, wherein the first portion of the sidewall may include multiple regions equally spaced apart around the sidewall and the second portion of the sidewall may include remaining regions of the sidewall; the first portion of the sidewall and the second portion of the sidewall may be opposite sides of the sidewall; and the method may also include, after step (e), depositing an encapsulant to form a conformal coating over the magnetoresistive stack.

Although various embodiments of the present disclosure have been illustrated and described in detail, it will be readily apparent to those skilled in the art that various modifications may be made without departing from the present disclosure.

What is claimed is:

1. A magnetoresistive device, comprising:
   a magnetically fixed region;
   a magnetically free region positioned above or below the magnetically fixed region;
   an intermediate region positioned between the magnetically fixed region and the magnetically free region;
   a spin Hall channel region extending at least partially around a sidewall of at least the magnetically free region; and
   an insulator region extending around a portion of the sidewall such that (a) the insulator region contacts a first portion of the sidewall and (b) the spin Hall channel region contacts a second portion of the sidewall.

2. The magnetoresistive device of claim 1, wherein the sidewall has a substantially circular or a substantially elliptical cross-sectional shape.

3. The magnetoresistive device of claim 2, wherein the first portion of the sidewall extends over an angle of about 180° and the second portion of the sidewall extends over an angle of about 180°.

4. The magnetoresistive device of claim 2, wherein the first portion of the sidewall includes multiple regions equally spaced apart around the sidewall and the second portion of the sidewall includes remaining regions of the sidewall.

5. The magnetoresistive device of claim 1, wherein the first portion of the sidewall and the second portion of the sidewall are opposite sides of the sidewall.

6. The magnetoresistive device of claim 1, wherein the first portion of the sidewall includes two spaced apart and oppositely positioned first regions of the sidewall, and the second portion of the sidewall includes a portion of the sidewall extending between the two first regions on one side of the sidewall.

7. The magnetoresistive device of claim 1, wherein the spin Hall channel region is formed of a positive spin-Hall material.

8. The magnetoresistive device of claim 1, wherein the spin Hall channel region is formed of a negative spin-Hall material.

9. The magnetoresistive device of claim 1, wherein the insulator region is formed of at least one of silicon, silicon oxide, silicon nitride, magnesium oxide, or aluminum oxide.

10. A magnetoresistive device, comprising:
    a magnetically fixed region;
    a magnetically free region positioned above or below the magnetically fixed region;
    an intermediate region positioned between the magnetically fixed region and the magnetically free region;
    a spin Hall channel region extending at least partially around a sidewall of at least a portion of the magnetically free region, wherein the sidewall has one of a substantially circular or a substantially elliptical cross-sectional shape; and
    an insulator region extending around a portion of the sidewall such that (a) the insulator region contacts a first portion of the sidewall and (b) the spin Hall channel region contacts a second portion of the sidewall, wherein the first portion of the sidewall extends over an angle of about 180°, and the second portion of the sidewall extends over an angle of about 180°.

11. The magnetoresistive device of claim 10, wherein the spin Hall channel region is formed of a positive spin-Hall material.

12. The magnetoresistive device of claim 10, wherein the spin Hall channel region is formed of a negative spin-Hall material.

13. The magnetoresistive device of claim 10, wherein the insulator region is formed of at least one of silicon, silicon oxide, silicon nitride, magnesium oxide, or aluminum oxide.

14. The magnetoresistive device of claim 10, wherein the spin Hall channel region extends at least partially around the sidewall of at least a portion of the magnetically free region and the magnetically fixed region.

15. A method of fabricating a magnetoresistive device, comprising:
    (a) forming a magnetoresistive stack on a substrate, wherein the magnetoresistive stack includes a magnetically fixed region, a magnetically free region, and an intermediate region positioned between the magnetically fixed region and the magnetically free region;
    (b) etching at least a portion of the magnetoresistive stack to form a sidewall on at least a portion of the magnetically free region;
    (c) after step (b), depositing an insulator on at least the sidewall;
    (d) after step (c), etching at least a portion of the deposited insulator to expose a portion of the sidewall; and
    (e) after step (d), depositing a spin-Hall material such that (i) the insulator contacts a first portion of the sidewall and (ii) the spin-Hall material contacts a second portion of the sidewall.

16. The method of claim 15, wherein the etching in step (d) includes Ion Beam Etching (IBE) without rotation of the substrate.

17. The method of claim 15, wherein the sidewall has a substantially circular or a substantially elliptical cross-sectional shape, and wherein the first portion of the sidewall extends over an angle of about 180°, and the second portion of the sidewall extends over an angle of about 180°.

18. The method of claim 15, wherein the sidewall has a substantially circular or a substantially elliptical cross-sectional shape, and wherein the first portion of the sidewall includes multiple regions equally spaced apart around the sidewall and the second portion of the sidewall includes remaining regions of the sidewall.

19. The method of claim 15, wherein the first portion of the sidewall and the second portion of the sidewall are opposite sides of the sidewall.

20. The method of claim 15, further including, after step (e), depositing an encapsulant to form a conformal coating over the magnetoresistive stack.

* * * * *